United States Patent
Arai et al.

(10) Patent No.: US 8,153,207 B2
(45) Date of Patent: *Apr. 10, 2012

(54) FINE PARTICLE-CONTAINING BODY, FINE PARTICLE-CONTAINING BODY MANUFACTURING METHOD, STORAGE ELEMENT, SEMICONDUCTOR DEVICE AND ELECTRONIC EQUIPMENT

(75) Inventors: Nobutoshi Arai, Nara-ken (JP); Hiroshi Iwata, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/488,378

(22) Filed: Jun. 19, 2009

(65) Prior Publication Data

US 2009/0252888 A1 Oct. 8, 2009

Related U.S. Application Data

(62) Division of application No. 11/212,712, filed on Aug. 29, 2005, now abandoned.

(30) Foreign Application Priority Data

Aug. 30, 2004 (JP) ................. P2004-250421

(51) Int. Cl.
C23C 14/48 (2006.01)
C23C 14/58 (2006.01)
C23C 14/08 (2006.01)
C23C 14/10 (2006.01)
C23C 14/18 (2006.01)

(52) U.S. Cl. ........ 427/526; 427/527; 427/529; 427/531; 427/255.18; 427/255.19; 427/376.2; 427/376.3; 427/419.3

(58) Field of Classification Search ................. None
See application file for complete search history.

(56) References Cited

U.S. PATENT DOCUMENTS

| 4,520,040 A | * | 5/1985 | Cordts ........................ 427/528 |
| 5,624,741 A | | 4/1997 | Scott |
| 6,054,349 A | * | 4/2000 | Nakajima et al. ............ 438/257 |
| 6,090,666 A | | 7/2000 | Ueda et al. |

(Continued)

FOREIGN PATENT DOCUMENTS

JP 2000-022005 1/2000

(Continued)

OTHER PUBLICATIONS

Machine translation of JP 2004-281498 A, published Jul. 2004, to inventors Arai et al.*

*Primary Examiner* — Marianne L Padgett
(74) *Attorney, Agent, or Firm* — Birch, Stewart, Kolasch & Birch, LLP

(57) ABSTRACT

A silicon oxide of a film thickness of about 50 nm is formed on a surface of a silicon substrate by thermal oxidation. Silver is implanted into the silicon oxide with implantation energy of about 30 keV by a negative ion implantation method. By subjecting the silicon oxide, into which the silver has been implanted, to heat treatment at a temperature of not lower than 200° C. and lower than the melting point of silver, silver particles are formed. By oxidizing the surface portions of the fine particles by heat treatment in an oxidizing atmosphere, silver oxide is formed as a coating layer.

4 Claims, 17 Drawing Sheets

U.S. PATENT DOCUMENTS

| | | | |
|---|---|---|---|
| 6,294,223 B1 * | 9/2001 | Hampikian et al. | 427/526 |
| 6,361,912 B2 | 3/2002 | Fonash et al. | |
| 6,774,061 B2 * | 8/2004 | Coffa et al. | 438/197 |
| 7,030,456 B2 * | 4/2006 | Arai et al. | 257/508 |
| 7,187,043 B2 * | 3/2007 | Arai et al. | 257/405 |
| 7,790,051 B1 * | 9/2010 | Carroll | 216/87 |
| 7,851,777 B2 * | 12/2010 | Arai et al. | 257/2 |
| 2003/0132432 A1 * | 7/2003 | Yoshii et al. | 257/17 |
| 2003/0230629 A1 * | 12/2003 | Bourianoff et al. | 235/454 |
| 2004/0109483 A1 * | 6/2004 | Simpson et al. | 372/39 |
| 2004/0180491 A1 * | 9/2004 | Arai et al. | 438/200 |
| 2004/0183647 A1 * | 9/2004 | Arai et al. | 338/13 |
| 2004/0214362 A1 * | 10/2004 | Hill et al. | 438/33 |
| 2006/0110883 A1 * | 5/2006 | Min | 438/260 |
| 2008/0003736 A1 * | 1/2008 | Arai et al. | 438/200 |

FOREIGN PATENT DOCUMENTS

| | | |
|---|---|---|
| JP | 2000-340682 A * | 12/2000 |
| JP | 2002-252290 | 9/2002 |
| JP | 2003-068896 | 3/2003 |
| JP | 2004-006882 | 1/2004 |
| JP | 2004-048062 | 2/2004 |
| JP | 2004-281498 | 10/2004 |

* cited by examiner

FINE PARTICLE-CONTAINING BODY, FINE PARTICLE-CONTAINING BODY MANUFACTURING METHOD, STORAGE ELEMENT, SEMICONDUCTOR DEVICE AND ELECTRONIC EQUIPMENT

CROSS-REFERENCE TO RELATED APPLICATION

The present application is a 37 C.F.R. §1.53 (b) divisional of U.S. application Ser. No. 11/212,712 filed Aug. 29, 2005, now abandoned, which in turn claims priority on Japanese Application No. 2004-250421 filed Aug. 30, 2004. The entire contents of each of these applications is hereby incorporated by reference.

BACKGROUND OF THE INVENTION

The present invention relates to a fine particle-containing body that contains a fine particle, a fine particle-containing body manufacturing method, a storage element, a semiconductor device and electronic equipment and relates, in particular, to a fine particle-containing body that employs a fine particle of a nanometer size.

In recent years, for example, a single electron transistor and a memory that contains a fine particle called a nanodot and nanocrystal in its gate insulator have been proposed as ultra-micro electronic device that employs a fine particle of a nanometer size.

As a method for forming such a fine particle of, for example, an Si (silicon) fine particle for an electronic device, a method for depositing amorphous silicon on a silicon thermal oxide by means of an LPCVD (Low Pressure Chemical Vapor Deposition) apparatus, thereafter forming an Si microcrystal through an annealing process and further depositing a silicon oxide on the silicon thermal oxide where the Si microcrystal has been formed by a CVD (Chemical Vapor Deposition) method is proposed (refer to, for example, JP 2000-22005 A).

Moreover, as another method for forming a fine particle, a method for forming a thin film on a substrate by using CVD, vapor deposition, MBE (Molecular Beam Epitaxy) and the like and thereafter scaling down the thin film by using a fine processing technology of photolithography, etching and the like is proposed. According to the method, the fine particle is formed, and thereafter, an insulator layer is layered on it.

Moreover, as another method for forming a fine particle, a method for implanting metal ions into an insulator by ion implantation and condensing the implanted ions by heat treatment to form a metal particle is proposed.

However, the method of forming the Si microcrystal on the silicon thermal oxide through the annealing process, which repeats the process of depositing the silicon thermal oxide, therefore has a problem that much time is needed for manufacturing. Moreover, the method has a problem that the time and effort for the manufacturing increase because of the necessity of repeating many times the processes from the deposition of the silicon thermal oxide to the annealing in order to increase the surface density of the Si fine particles.

Moreover, the method of using the fine processing technology of etching and the like has a problem that it is extremely difficult to concurrently reduce the size of the fine particles and a distance between fine particles to the nanometer order.

On the other hand, the method of forming a fine particle in the insulator by the ion implantation method is able to comparatively easily form a fine particle of the nanometer size in an isolated state in the insulator. However, when fine particles are formed by the ion implantation method, it is general that a large number of interface states are generated at the interfaces between the fine particles and the insulator. Therefore, forming an elemental device by employing the insulator, in which the fine particles are formed, causes a problem that a prescribed performance cannot be obtained or the characteristics vary. For example, if a storage element is formed by employing the insulator in which the fine particles have been formed, electric charge leakage from the fine particles that should retain the electric charge easily occurs, and variations in the retention characteristics of the electric charges of the fine particles occur. As described above, the conventional methods for forming fine particles have a problem that it is uneasy to stably obtain a fine particle-containing body of satisfactory characteristics.

SUMMARY OF THE INVENTION

An object of the present invention is to provide a fine particle-containing body capable of obtaining satisfactory characteristics and a fine particle-containing body manufacturing method capable of manufacturing a fine particle-containing body of satisfactory characteristics with comparatively reduced time and effort.

In order to achieve the above object, a fine particle-containing body of the present invention includes:
a first layer;
a second layer;
a medium that is formed between the first layer and the second layer and made of a first material;
one or more fine particles that are located in the medium and are made of a second material; and
a coating layer that covers said or each fine particle and is made of a third material,
the second material being a material that has a function to retain an electric charge, and
the third material being a material whose electrical conductivity is lower than that of the second material.

According to the construction, the fine particle made of the second material is covered with the coating layer made of the third material, and therefore, the electric charge is prevented from undesirable moving between the fine particle and the medium. Accordingly, the quantity of electric charge retained in the fine particle fluctuates less for a long time, and therefore, the charge retention characteristic of the fine particle-containing body is stabilized for a long time. Moreover, the fine particle is covered with the coating layer, and therefore, the constituents of the fine particle are prevented from flowing out, and the constituents of the other portions are prevented from flowing into the fine particle. Therefore, a characteristic degradation due to a change with the lapse of time of the fine particle-containing body is prevented.

Moreover, since the fine particle is made of the second material that has a function to retain an electric charge, the retainable amount of charge is comparatively large. Therefore, even if some increase or decrease in the electric charge occurs, the ratio of fluctuation to the total amount of charge retained in the fine particles is comparatively small. Therefore, since the amount of fluctuation in the electric charge is reduced for a long time, the retention characteristic of the electric charge is stabilized for a long time in the fine particle-containing body.

In the present specification, the definition of the "layer" is not limited only to an object that has a configuration extending in the planar direction but inclusive of a partial region formed from an integrated object so as to have a characteristic different from that of the other region by, for example, impurity diffusion.

Moreover, the first and second layers need not be put in contact with the medium, and the medium is only required to be located between the first and second layers.

Moreover, in the present specification, the "fine particle" means a particle of which the particle size (diameter) is smaller than 1 μm.

Moreover, the arrangement that the fine particle is "located in the medium" means not only a state in which the fine particle is completely contained in the medium but also a state in which the fine particle partially sinks in the medium and the other portion is projecting from the surface of the medium.

In the fine particle-containing body of one embodiment, the coating layer that covers the fine particle or at least one of the fine particles partially protrudes from the medium.

According to the embodiment, the electric charge can be delivered and received between the fine particle and another part via a portion of the coating layer protruding from the medium not by way of the medium. Therefore, it is possible to reduce the voltage necessary for delivering and receiving an electric charge and reduce a time needed for delivering and receiving the electric charge. Therefore, an electronic device capable of operating at high speed with a low voltage can be provided.

In the fine particle-containing body of one embodiment, the coating layer that covers the fine particle or at least one of the fine particles is partially in contact with at least one of the first and second layers.

According to the embodiment, at least one of the fine particles has its coating layer, which covers the fine particle, partially put in contact with at least one of the first and second layers. This arrangement allows the electric charge to be delivered and received to and from at least one of the first and second layers not by way of the medium. Therefore, it is possible to reduce the voltage necessary for delivering and receiving the electric charge and reduce the time needed for delivering and receiving the electric charge. Therefore, an electronic device capable of operating at high speed with a low voltage can be provided.

In the fine particle-containing body of one embodiment, the fine particle or at least one of the fine particles is connected to a path that connects the fine particle with the first or second layer not by way of the medium.

According to the embodiment, the fine particle can deliver and receive the electric charge to and from the first or second layer via the coating layer not by way of the medium. Therefore, it is possible to reduce the voltage necessary for delivering and receiving the electric charge and reduce the time needed for delivering and receiving the electric charge. Therefore, an electronic device capable of operating at high speed with a low voltage can be provided.

In the fine particle-containing body of one embodiment, at least two of the fine particles are connected to a path that connects the fine particles with each other not by way of the medium.

According to the embodiment, since the medium does not exist between the fine particles, the arrangement density of the fine particles in the medium can be improved.

In the fine particle-containing body of one embodiment, the fine particle or at least one of the fine particles has a roughly spherical shape, and the roughly spherical fine particle has a ratio of a distance from a center of gravity to an outer peripheral surface portion located farthest from the center of gravity with respect to a distance from the center of gravity to an outer peripheral surface portion located nearest to the center of gravity, the ratio being not smaller than 1.0 and not greater than 1.5.

According to the embodiment, since the fine particle has a nearly true spherical shape, electric field concentration hardly occurs. Therefore, since the fluctuations and variations in the electrical characteristics attributed to the electric field concentration occurring in the fine particle portion can be suppressed, an electronic device of comparatively high reliability can be provided.

In the fine particle-containing body of one embodiment, the first and second layers have electrical conductivity.

According to the embodiment, an electric charge can be put in and out of the fine particle by using the first and second layers as, for example, electrodes. Therefore, an electronic device can be provided.

In the present specification, the "conductor" or the substances that have "electrical conductivity" include metals and semiconductors and also include organic substances so long as the substances have electrical conductivity.

In the fine particle-containing body of one embodiment, the third material is a material that has an electrical insulation property.

According to the embodiment, the fine particle is electrically insulated by the coating layer formed of the third material, and therefore, the charge retention characteristic of the fine particle is improved.

In the fine particle-containing body of one embodiment, an energy gap between a lower end of a conduction band of the second material and a vacuum level is greater than an energy gap between a lower end of a conduction band of the third material and the vacuum level.

According to the embodiment, the fine particle formed of the second material can effectively retain electrons.

In the fine particle-containing body of one embodiment, an energy gap between an upper end of a valence band of the second material and a vacuum level is smaller than an energy gap between an upper end of a valence band of the third material and the vacuum level.

According to the embodiment, the fine particle formed of the third material can effectively retain holes.

In the fine particle-containing body of one embodiment, the first and third materials are the materials that have electrical insulation property, and the second material is the material that has electrical conductivity.

According to the embodiment, the fine particle is formed of the second material and has electrical conductivity, the coating layer that covers the fine particle is formed of the third material and has electrical conductivity, and the medium that retains the fine particle and the coating layer is formed of the first material and has an electrical insulation property. Therefore, the amount of charge that can be retained per unit volume by the fine particle can be made comparatively large. With this arrangement, the ratio of the change to the total amount of charge is reduced even if the amount of charge retained by the fine particle somewhat fluctuates. As a result, a stable charge retention characteristic is obtained. Moreover, the fine particle is covered with the coating layer that has an electrical insulation property and is located in the medium that has an electrical insulation property. Therefore, the charge retention characteristic of the fine particle is effectively stabilized.

In the fine particle-containing body of one embodiment, the second material is a semiconductor.

According to the embodiment, the fine particle is formed of the semiconductor that is the second material, and therefore, a prescribed amount of charge can be retained under the stable charge retention characteristic.

In the fine particle-containing body of one embodiment, the first and third materials are mutually different insulating materials.

According to the embodiment, the medium that retains the fine particle and the coating layer is made of the insulating material different from that of the coating layer, the inflow and the outflow of an electric charge to and from the fine particle are effectively suppressed. Therefore, the fine particle-containing body obtains a stable charge retention characteristic.

In the fine particle-containing body of one embodiment, the third material is obtained by making the second material insulative.

According to the embodiment, the interface between the coating layer formed of the third material and the fine particle formed of the second material is in a satisfactory state in which, for example, the interface states are comparatively reduced. Therefore, since the fine particle made of the second material has a comparatively small leakage of the retained electric charge, a fine particle-containing body of a satisfactory charge retention characteristic is obtained.

In the present specification, "make insulative" and "insulate" mean changing a substance that has an electrical conductivity into a substance that substantially has no electrical conductivity. Moreover, it means substantially loosing the electrical conductivity of a substance.

In the fine particle-containing body of one embodiment, the third material is obtained by oxidizing or nitriding the second material.

According to the embodiment, the third material can be formed from the second material by using the existing oxidation reactor or the like widely used in the semiconductor industry. Therefore, by using the conventional manufacturing facility, a fine particle-containing body that has satisfactory characteristics can be manufactured at low cost.

The third material is required to be formed oxidized or nitrided to the extent that the third material comes to have a resistance higher than that of the second material. Moreover, the second material should preferably be oxidized or nitrided to the extent that the third material becomes a complete insulator.

In the fine particle-containing body of one embodiment, the first material is a silicon oxide or a silicon nitride, the second material is a semiconductor or a metal, and the third material is a semiconductor oxide or a metal oxide.

According to the embodiment, the first material is a silicon oxide or silicon nitride, and the semiconductor oxide or metal oxide of the third material is obtained by oxidizing the semiconductor or metal of the second material. Therefore, the materials can be produced by using the existing apparatus used in the semiconductor industry. Therefore, a fine particle-containing body, which has satisfactory characteristics, can be formed comparatively easily at low cost.

In the fine particle-containing body of one embodiment, the second material is silicon, and the third material is a silicon nitride.

According to the embodiment, the coating layer, which covers the fine particle, is formed of the silicon nitride that is the third material, and the silicon nitride has a high dielectric constant. Therefore, since the electric field of the coating layer is increased, an electric charge can efficiently be put into and out of the fine particle. Moreover, the silicon nitride, which is used in a large amount in the semiconductor industry, can be mass-produced comparatively easily by the existing manufacturing equipment. For example, by nitriding the surface portion of the fine particle made of silicon, the coating layer made of the silicon nitride can be formed comparatively easily by the existing semiconductor manufacturing equipment. Therefore, a fine particle-containing body, which has satisfactory characteristics, can be formed comparatively easily at low cost.

In the fine particle-containing body of one embodiment, the second material is aluminum, and the third material is an aluminum oxide.

According to the embodiment, the fine particle, which is made of aluminum, is covered with the coating layer formed of aluminum oxide that is a fine and firm insulator. Therefore, the fine particle has the retained electric charge effectively prevented from leaking, and the electric charge retention state is stably maintained. Therefore, a fine particle-containing body, which has a satisfactory reliability, is obtained. Moreover, by, for example, oxidizing the surface portion of the fine particle made of aluminum, the coating layer made of aluminum oxide can be formed comparatively easily by the existing semiconductor manufacturing equipment.

In the fine particle-containing body of one embodiment, the second material is hafnium, and the third material is a hafnium oxide.

According to the embodiment, the coating layer that covers the fine particle is formed of hafnium oxide of which the dielectric constant is comparatively high. Therefore, a large electric field can be generated when same voltage is applied in comparison with the case where it is formed of a substance of which the dielectric constant is comparatively low. Therefore, an electric charge can efficiently be put into and out of the fine particle. Moreover, by, for example, oxidizing the surface portion of the fine particle made of hafnium, the coating layer made of hafnium oxide can be formed comparatively easily by the existing semiconductor manufacturing equipment.

In the fine particle-containing body of one embodiment, the first layer is a silicon substrate, and the first material is a silicon oxide or a silicon nitride.

According to the embodiment, a fine particle-containing body can be produced easily at low cost by the existing semiconductor manufacturing equipment. Moreover, other elements can easily be consolidated, so that high versatility and practicability are obtained. Moreover, by, for example, oxidizing or nitriding the surface portion of the silicon substrate, the first layer, which is the portion other than the surface portion of the silicon substrate, and the medium, which is the silicon oxide or silicon nitride on the first layer, can be formed comparatively easily.

According to one aspect of the present invention, there is provided a method for manufacturing the fine particle-containing body including the processes of:

forming a medium, into which a substance for forming at least one fine particle has been introduced, on the first or second layer;

forming the fine particle from the substance introduced into the medium; and reforming the surface portion of the fine particle.

According to the construction, the medium, into which the substance for forming the fine particle has been introduced, is formed on the first or second layer, the fine particle is formed of the substance, and the surface portion of the fine particle is reformed. Through the reforming of the surface portion, a coating layer is formed by, for example, insulating the surface portion of the fine particle. Otherwise, through the reforming of the surface portion, the defects of dangling bond and the like are reduced by being terminated by hydrogen molecules by, for example, implanting hydrogen ions. Through the reforming like this, the surface of the fine particle is put into a satisfactory state in which the interface states and the like are reduced. Therefore, according to the manufacturing method, a fine particle-containing body, which can stably retain an electric charge in the fine particle, can be produced.

In the method of one embodiment, the process of forming the medium, into which the substance for forming the fine particle has been introduced, on the first or second layer includes the processes of:

forming a medium on the first or second layer; and
introducing a substance for forming the fine particle into the medium.

According to the embodiment, the medium is formed on the first or second layer, and the substance for forming the fine particle is introduced into the medium. By forming the medium in one process, a fine particle-containing body can be manufactured more easily than the conventional fine particle-containing body manufacturing method repeating a plurality of medium forming processes and fine particle forming processes.

In the method of one embodiment, the process of introducing the substance for forming the fine particle into the medium is the process of introducing the substance into the medium by implantation.

According to the embodiment, the substance for forming a large amount of the fine particles can be introduced into the medium at a time by implantation. Therefore, the fine particle can easily be formed through a small number of processes.

In the method of one embodiment, the process of introducing the substance for forming the fine particle in the medium is the process of introducing the substance into the medium by the ion implantation method.

According to the embodiment, the substance for forming a large amount of the fine particles is implanted into the medium at a time by the ion implantation method. Therefore, the fine particle can easily be formed through a small number of processes.

The process of introducing the substance for forming the fine particle into the medium may be the process of making the particulate substance rush into the medium by giving a prescribed velocity to the substance like, for example, sputtering other than the ion implantation method.

Depending on the conditions for carrying out the implantation, a fine particle is sometimes formed only by implantation even if the process of forming the fine particle by, for example, heat treatment is not carried. That is, when a prescribed kind of particle formation substance is implanted on prescribed conditions, the process of introducing the substance for forming the fine particle can concurrently serve as the process of forming the fine particle. Therefore, the number of processes can be reduced. Moreover, when the implantation is carried out at comparatively high temperature, the reforming of the surface portion of the fine particle is sometimes effected by heat treatment in addition to the formation of the fine particle. That is, the process of introducing the substance for forming the fine particle can concurrently serve as the process of forming the fine particle and the process of reforming the surface portion of the fine particle, and the number of processes can be reduced.

In the method of one embodiment, the substance is implanted into the medium in a direction that makes an acute angle with respect to the surface of the medium.

According to the embodiment, since the substance is implanted in the direction that makes an acute angle with respect to the surface of the medium, the fine particles are formed in shallow portions of the medium. Moreover, the fine particles are formed in a comparatively narrow range in the thickness direction of the medium. Therefore, the medium containing the fine particles can be formed into a thin film.

In the method of one embodiment, the fine particle-containing body manufacturing method further includes a process of making the substance for forming the fine particle into negative ions.

According to the embodiment, since the substance for forming the fine particle is formed into negative ions, the medium to be subjected to the implantation is prevented from being charged with high voltage in comparison with the case where the substance is implanted in the form of positive ions. The problem of electrification when the substance is formed into positive ions is remarkable particularly when the medium is an insulator or when the medium is electrically floated by an insulator or the like. Therefore, by forming the substance into negative ions, the variation in the implantation depth of the substance and the generation of defects in the medium into which the substance is implanted are effectively prevented.

The method of one embodiment further includes a process of:

removing a portion from the surface of the medium to a prescribed depth,
subsequently to the process of introducing the substance for forming the fine particle into the medium.

According to the embodiment, the portion of the medium, which ranges from the surface to a prescribed depth and serves as the portion where the introduction density of the substance for forming the fine particles is comparatively low, is removed. Therefore, a medium, which can be formed into a thin film and in which the density of the fine particles is comparatively large, can be formed.

In the method of one embodiment, the process of introducing the substance for forming the fine particles into the medium is:

the process of introducing the substance for forming the fine particles into the medium by the solid phase diffusion method.

According to the embodiment, a large amount of the substance for forming the fine particles can be diffused in the medium by the solid phase diffusion method. Moreover, the solid phase diffusion method can be carried out by an apparatus of a comparatively simple construction, and therefore, a large number of fine particles can be formed comparatively easily in the medium.

Depending on the conditions for carrying out the solid phase diffusion method, the fine particle is sometimes formed only by solid phase diffusion even if the process of forming the fine particle by, for example, heat treatment is not carried out. That is, when a prescribed kind of particle formation substance is diffused on prescribed conditions, the process of introducing the substance for forming the fine particle can concurrently serve as the process of forming the fine particle. Therefore, the number of processes can be reduced. Moreover, when solid phase diffusion is carried out at comparatively high temperature, the reforming of the surface portion of the fine particle is sometimes effected by heat treatment in addition to the formation of the fine particle. That is, the process of introducing the substance for forming the fine particle can concurrently serve as the process of forming the fine particle and the process of reforming the surface portion of the fine particle, and the number of processes can be reduced.

The method of one embodiment further includes a process of applying a solution, in which the substance for forming the fine particle is contained, onto the surface of the medium.

According to the embodiment, the substance for forming the fine particle can easily be introduced into the medium through a reduced number of processes. Moreover, the process of applying the solution can be carried out by a comparatively simple apparatus. Therefore, a large number of fine particles can be formed comparatively easily in the medium.

In the method of one embodiment, the process of forming the medium, into which the substance for forming the fine particle has been introduced, on the first or second layer includes the process of:

applying a liquid material of the medium, which contains the substance, onto the first or second layer.

According to the embodiment, the process of applying the solution can be carried out by a comparatively simple apparatus, and therefore, the medium, into which the material has been introduced, can easily be formed on the first or second layer through a reduced number of processes.

In the method of one embodiment, the process of reforming the surface portion of the fine particle includes the process of oxidizing or nitriding the surface portion of the fine particle.

According to the embodiment, the surface portion of the fine particle is reformed by being oxidized or nitrided. The process of oxidizing or nitriding the surface portion of the fine particle is carried out comparatively easily by the existing semiconductor manufacturing equipment. Therefore, the coating layer, which covers the fine particle, can be formed comparatively easily at low cost.

In the method of one embodiment, the process of reforming the surface portion of the fine particle includes the process of implanting molecules that contain oxygen or nitrogen into the medium.

According to the embodiment, since the molecules that contain oxygen or nitrogen are implanted into the medium, the concentration profile of oxygen or nitrogen in the depthwise direction of the medium can be controlled. Therefore, by making the concentration of oxygen or nitrogen in a region located at a prescribed depth away from the surface higher than that of the other regions, the fine particle in the prescribed region can be locally highly oxidized or nitrided.

In the method of one embodiment, the process of forming the fine particle from the substance introduced into the medium and the process of reforming the surface portion of the fine particle are:

the process of subjecting the medium, into which the substance for forming the fine particle has been introduced by the implantation, to heat treatment in an oxidizing atmosphere or a nitriding atmosphere.

According to the embodiment, the process of carrying out heat treatment in the oxidizing atmosphere or the nitriding atmosphere can be carried out by the existing semiconductor manufacturing equipment. Therefore, a coating layer, which is made of the oxide or nitride of the material for forming the fine particle, can be formed easily at low cost on the surface portion of the fine particle.

The method of one embodiment further includes a process of removing a portion of the medium from the surface to a prescribed depth, subsequently to the process of forming fine particles from the substance introduced into the medium.

According to the embodiment, the portion of the medium is removed from the surface, which is the portion where the density of the fine particles is comparatively low, to the prescribed depth. Therefore, the medium can be formed into a thin film, and a medium, in which the fine particle density is comparatively large as a whole, can be formed.

In the method of one embodiment, the process of introducing the substance for forming fine particles into the medium and the process of removing the surface portion of the medium are carried out together.

According to the embodiment, the surface portion of the medium is removed. Therefore, a portion in which the concentration of the substance is comparatively small can be removed, and the portion in which the concentration of the substance is comparatively large can be exposed. Moreover, since the surface portion of the medium is removed and the substance is introduced into the medium, a portion in which the substance has a prescribed concentration can promptly be exposed. Moreover, when the processes are carried out in a high-temperature atmosphere, the substance located in the neighborhood of the exposed portion obtained by removing the surface portion can efficiently be heated. Therefore, fine particles can efficiently be generated.

According to one aspect of the present invention, there is provided a method for manufacturing the fine particle-containing body including the processes of:

introducing a substance for forming at least one fine particle into a precursor of the medium;

reforming a part of the precursor into which the substance has been introduced;

removing the reformed portion of the precursor; and reforming a portion other than the removed portion of the precursor.

According to the construction, the substance for forming the fine particles is introduced into the precursor of the medium, the precursor into which the substance has been introduced is partially reformed, and the reformed portion is removed. By reforming the region to be removed of the precursor, the region can be removed by being selected comparatively easily. Moreover, since the portion other than the removed portion of the precursor is reformed, the reformation can appropriately be carried out according to the conditions of, for example, the concentration of the substance introduced into the portion other than the removed portion. As a result, the medium, the coating layer and the fine particles can appropriately be formed in the portion other than the removed portion of the precursor.

According to one aspect of the present invention, there is provided a method for manufacturing the fine particle-containing body including the processes of:

forming a control layer for controlling introduction of a substance for forming at least one fine particle on a surface of a precursor of the medium;

introducing the substance for forming the fine particle into the precursor of the medium via the control layer;

forming the fine particle from the substance introduced into the precursor;

removing the control layer; and reforming the precursor from which the control layer is removed.

According to the construction, the substance is introduced into the precursor via the control layer, and therefore, the substance can be introduced into the precursor at an appropriate concentration. Moreover, the range in which the substance is distributed can be adjusted into an appropriate range in the depthwise direction of the precursor. Therefore, fine particles distributed at an appropriate density in an appropriate range can be formed in the precursor. Moreover, by reforming the precursor from which the control layer has been removed, the medium and the coating layers that cover the fine particles can be obtained.

In the method of one embodiment, the process of forming the fine particles is carried out before the process of removing the control layer.

According to the embodiment, the control layer is removed after the formation of the fine particles in the precursor, and therefore, the surface of the precursor in which the fine particles have been formed at a prescribed density can be exposed.

In the method of one embodiment, the process of forming the fine particles is carried out after the process of removing the control layer.

According to the embodiment, fine particles can be formed in the precursor in the absence of the influence of the control layer.

In the method of one embodiment, the process of removing the control layer and the process of introducing the substance for forming fine particles in the precursor is carried out together.

According to the embodiment, the control layer is removed and the substance is introduced into the precursor, and therefore, the portion of the prescribed concentration of the substance can promptly be exposed. Moreover, the substance located in the neighborhood of the exposed surface portion of the precursor can efficiently be heated when the process is carried out in a high-temperature atmosphere, and therefore, fine particles can be generated with high efficiency.

According to one aspect of the present invention, there is provided a storage element having a field effect transistor formed by employing the fine particle-containing body.

According to the construction, the field effect transistor performs memory operation according to the amount of charge retained by the fine particles of the fine particle-containing body, and by detecting, for example, the magnitude of a drain current, the memory state of the fine particle-containing body can be distinguished. With this arrangement, a storage element, which has high mass productivity and excellent leakage tolerance and is able to be scaled down in size, is obtained.

According to one aspect of the present invention, there is provided a semiconductor device comprising a memory circuit integrated with the storage element.

According to the construction, the storage element can easily be miniaturized, and therefore, the semiconductor device can effectively be downsized by reducing the occupation area of the memory circuit.

According to one aspect of the present invention, there is provided an electronic equipment having the semiconductor device.

According to the construction, a compact semiconductor device, in which the occupation area of the memory circuit is comparatively small, is provided. Therefore, electronic equipment, which can effectively be downsized, can be obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
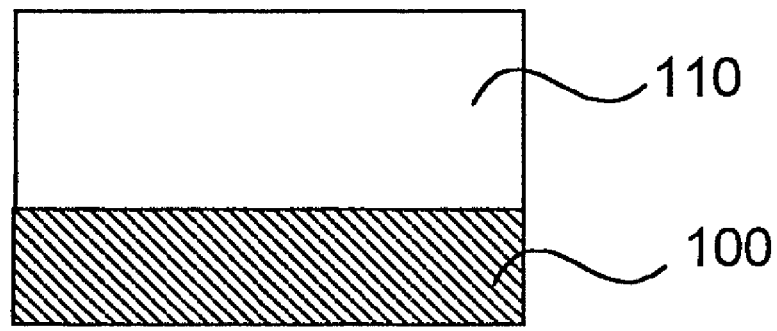
FIG. 1A is a view showing a process of a manufacturing method of a fine particle-containing body according to a first embodiment.

The present invention will be described in detail below by the embodiments shown in the drawings.

First Embodiment

FIGS. 1A to 1E are views showing processes of a manufacturing method of a fine particle-containing body according to a first embodiment. In the present embodiment, a silicon substrate 100 was used as a first layer. Although no particular second layer is shown in the figure, an electrode made of a metal or a semiconductor, overcoat or the like can be employed. It is noted that an electrode made of a metal or a semiconductor, overcoat or the like can be employed also for the first layer. Moreover, in the present embodiment, silver particles 130 were formed as fine particles, and a silicon oxide 140 of an insulator was formed as a coating layer for covering the silver particles.

First of all, as shown in FIG. 1A, the silicon oxide 110 is formed as a medium on the surface of a silicon substrate 100 through a thermal oxidation process. In the present embodiment, the oxide is formed to a film thickness of about 50 nm.

Figure 1B:
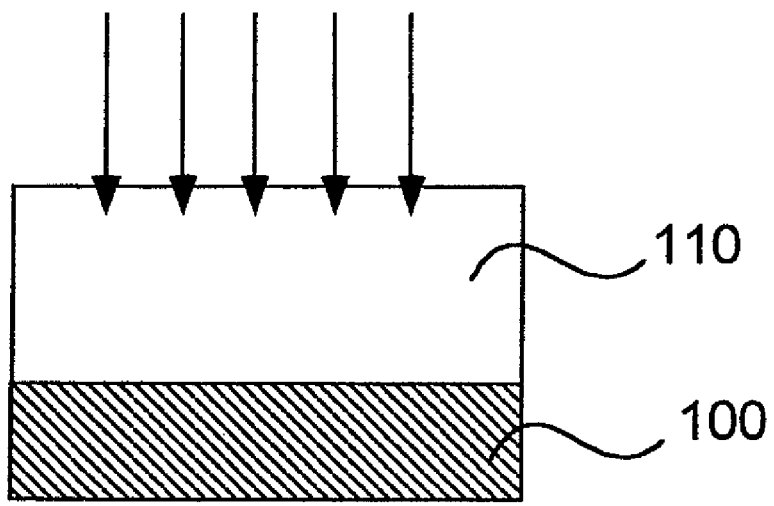
FIG. 1B is a view showing a process subsequent to the process of FIG. 1A.

Next, as shown in FIG. 1B, silver as a substance for forming fine particles is introduced into the silicon oxide 110 by the ion implantation method. In this case, excessively high implantation energy is not suitable for the implantation into the comparatively thin silicon oxide 110 since the implantation profile excessively spreads, and a defect is caused by damaging the silicon oxides 110. Therefore, the implantation energy should preferably be smaller than 100 keV and especially smaller than 50 keV. In the present embodiment, the implantation was carried out with about 30 keV in order to form fine particles in the vicinity of the center in the thickness direction of the silicon oxide 110.

Moreover, when the implantation dose is excessively large, the particle size of the fine particles becomes excessively large, and the damage to the silicon film 110 is also increased. If the implantation dose is excessively small, the fine particle density becomes excessively small. Therefore, the implantation dose should be greater than $1 \times 10^{12}/cm^2$ and smaller than $1 \times 10^{20}/cm^2$. For example, an implantation dose of greater than $1 \times 10e^{13}/cm^2$ and smaller than $1 \times 10e^{17}/cm^2$ is more preferable. In the present embodiment, silver was introduced by an implantation dose of about $1 \times 10^{15}/cm^2$ with energy of about 30 keV.

It is a matter of course that the implantation energy and the implantation dose to be selected are varied depending on the ionic type.

Moreover, the ion implantation method for implanting silver should preferably be the negative ion implantation method. When the implantation is carried out by using negative ions, the surface potential of the insulator (silicon oxide 110 in the present embodiment) subjected to the implantation does not rise close to the acceleration voltage of positive ions when positive ions are used and is able to be suppressed to a very low value of about several volts. That is, by the positive ion implantation method, a secondary electron of a negative charge is discharged when a positive charge ion is made incident on the surface of the insulator. Therefore, the surface of the insulator keeps being positively charged and eventually rises to the acceleration voltage of the positive ion. On the other hand, in the case of the negative ion implantation method, a negative charge ion is made incident to discharge the secondary electron of a negative charge, and the surface potential falls within a range of about positive and negative several volts. Therefore, the effective acceleration voltage fluctuates less than by the positive ion implantation method, and this therefore makes it possible to suppress the variation in the implantation depth of the substance (silver) for forming the conductive fine particles. Moreover, since the insulator is scarcely electrified, it becomes possible to suppress the occurrence of a defect due to dielectric breakdown or the like. In the present embodiment, a negative ion implanter of Nissin Electric Co., Ltd. was used.

Figure 1C:
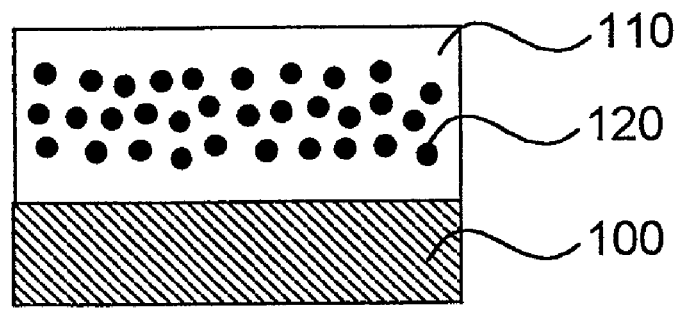
FIG. 1C is a view showing a process subsequent to the process of FIG. 1B.

Subsequently, the silicon oxide 110, into which the silver has been implanted, is subjected to heat treatment. By condensing or diffusing the implanted element (silver) by the heat treatment, silver particles 120 of a prescribed particle size are formed as shown in FIG. 1C. Moreover, it is also possible to repair the defect of the silicon oxide 110 generated during the ion implantation. With regard to the heat treatment temperature, no effect is produced when it is excessively low or no fine particle can be formed as a consequence of the diffusion and fusion of the implanted element when it is excessively high. Therefore, the temperature of the heat treatment should preferably be higher than 200° C. and lower than the melting point of the implanted element (silver). Moreover, even at same temperature, an increased effect is produced at the temperature when the processing time is elongated. However, if the processing time is excessively long, it is sometimes the case where the particle size of the fine particles is excessively increased or the case where the implanted element might diffuse to the outside of the region in which the fine particles are to be formed. Therefore, the processing time should preferably be shorter than 24 hours.

Subsequently, a coating layer is formed on the surface portions of the silver particles through a heat treatment process as a reforming process. Although the normal heat treatment is carried out in an inert atmosphere of argon or the like, the heat treatment is carried out in an atmosphere in which the surface portions of the fine particles are insulated according to the present invention. In the present embodiment, the heat treatment is carried out in a vapor phase containing oxygen to form silver particles 120, and the surface portions of the silver particles 120 are oxidized and insulated by supplying oxygen to the surfaces of the silver particles 120 by diffusing oxygen in the silicon oxide 110.

The conditions of the temperature, time, flow rate of the vapor phase and so on during the heat treatment are varied depending on the material to be employed, the desired fine particle size and the thickness of the insulating layer formed on the surface of the material.

Figure 1D:
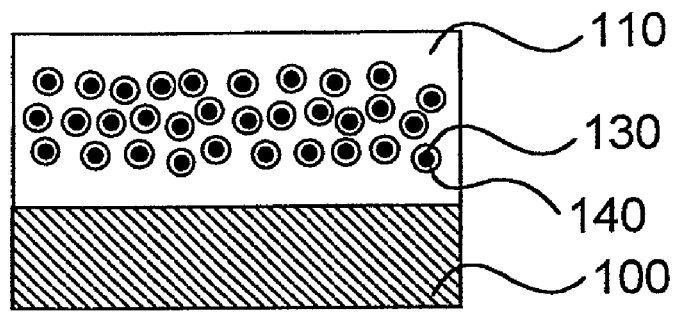
FIG. 1D is a view showing a process subsequent to the process of FIG. 1C.

In the present embodiment, the heat treatment is carried out for about several hours in an oxidizing atmosphere at a temperature slightly lower than that of silicon thermal oxidation conditions. As a result, the surface portions of the silver particles 120 are insulated as shown in FIG. 1D, forming a silver oxide 140 as the coating layer. That is, a process for reforming the surface portions of the fine particles is carried out.

During the heat treatment, the coating layer can also be formed by insulation achieved through nitriding other than the oxidation. For example, by carrying out heat treatment in, for example, an ammonia atmosphere after silicon is implanted as a substance for forming the fine particles, a coating layer made of silicon nitride can be formed on the surfaces of the fine particles.

Moreover, it is also possible to carry out heat treatment in an inert atmosphere of argon, nitrogen or the like in an initial stage to form fine particles to some extent and thereafter reform the surface portions by changing it to heat treatment in an atmosphere in which the formed fine particles are insulated. The method, which can achieve insulation after adjusting the size of the fine particles to an arbitrary size, is therefore able to accurately form fine particles of a variety of sizes. For example, in the case of a normal thermal processing furnace, it is preferable to carry out the heat treatment in the initial stage at a temperature of about 300° C. to 900° C. in an inert atmosphere of argon, nitrogen or the like. In the present embodiment, the heat treatment was carried out for about one hour in an argon atmosphere by means of a ceramics electric tube furnace of Asahi Rika Manufacturing, Co., Ltd. It is noted that this is in the case of silver particles, and the optimum heat treatment condition is varied depending on the element for forming the fine particles.

As described above, the process of reforming the surface portions of the fine particles by oxidation or nitriding can be carried out by using the existing semiconductor manufacturing equipment. Therefore, the surface portions of the fine particles can be reformed at a comparatively low cost.

It is further preferable to carry out heat treatment at a temperature of about 500 to 1000° C. in order to repair the defect that has occurred in the medium due to implantation in a case where the heat treatment for the formation of the fine particles is carried out at a comparatively low temperature. In this case, the fine particles are fused or diffused if the heat treatment is effected for a long time, and therefore, it is preferable to carry out RTA (Rapid Thermal Annealing), i.e., heat treatment for a short time.

Moreover, the fine particle-containing body manufacturing method of the present embodiment, which can suppress the electrification of the medium subjected to implantation by using the negative ion implantation method, therefore has an advantage that it is easy to carry out implantation to the intended depth and concentration. Moreover, the substance for forming the fine particles is introduced into the medium by implantation, and therefore, the fine particles of a nanometer size scattered at appropriate positions in the medium can be formed through a one-time process. Accordingly, there is no need to repeat again and again the thin film formation process and the microfabrication process of the thin film unlike the conventional case. Moreover, no nanoscale fine processing technology needs to be used, and therefore, productivity is satisfactory.

Further, the processes other than the process that uses the negative ion implantation method can be carried out by the existing semiconductor manufacturing equipment. Moreover, the negative ion implantation method can be carried out by changing only part of the existing ion implanter. Therefore, the fine particle-containing body can be produced at low cost. Moreover, by using the existing semiconductor manufacturing equipment, the fine particles can be consolidated with other semiconductor elements, which is practicable.

Figure 1E:
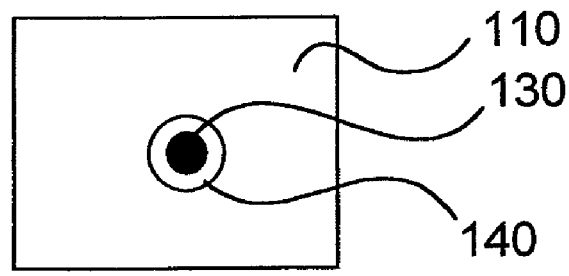
FIG. 1E is an enlarged view of a fine particle and a coating layer of FIG. 1D.

The appearance of the fine particles 130 formed by the fine particle-containing body manufacturing method of the present embodiment was examined by cross-section TEM (Transmission Electron Microscope) observation. As a result, as shown in FIG. 1D, silver implanted in the form of ions was condensed, and the so-called nanometer size silver particles 130 of a particle size (diameter) of about 2 to 3 nm were formed. Then, the silver oxide 140 was formed so as to cover the silver particles 130. The silver particles 130 were formed accurately distributed to the depth expected from the acceleration energy of silver ions. FIG. 1E is an enlarged view of part of FIG. 1D.

In FIG. 1D, the fine particle-containing body of the present invention is obtained by forming an electrode layer as a second layer (not shown) made of, for example, a metal on the silicon oxide 110 as the medium. The fine particle-containing body has the silicon substrate 100 as the first layer, the electrode layer and the silicon oxide 110 as the medium between the silicon substrate 100 and the electrode layer. The silicon oxide 110 retains at least one silver particle 130 as the fine particle covered with the silicon oxide 140 as the coating layer.

According to the fine particle-containing body of the construction, the silver particles 130 are covered with the silicon oxide 140, and therefore, an electric charge is prevented from needlessly moving inward and outward between the silver particles 130 and the silicon oxide 110. Moreover, the possible occurrence of the outflow of the silver component of the silver particles 130 and the inflow of other components into the silver particles 130 are prevented. Accordingly, the amount of charge retained in the silver particles 130 fluctuates less for a long time, and therefore, the fine particle-containing body can satisfactorily stably retain the electric charge for a long time. Moreover, a change in the characteristics due to a change with the lapse of time can be prevented.

Furthermore, since the silver particles 130 are formed of silver that has a function to retain an electric charge, the amount of retainable electric charge is comparatively large.

Therefore, even if some increase or decrease in the electric charge occurs, it becomes possible to suppress the ratio of the fluctuation with respect to the total amount of the electric charge retained in the silver particles 130. Accordingly, a fluctuation in the amount of the electric charge is reduced for a long time, and therefore, the fine particle-containing body can stably retain the electric charge for a long time.

Although silver was employed as the fine particles in the present embodiment, other conductors of metals of gold, copper and so on, semiconductors of silicon, germanium and so on can be employed. It is noted that gold is hardly oxidized, it is somewhat difficult to insulate the surface portions of the fine particles. On the other hand, a substance of, for example, aluminum, which forms a firm oxide on its surface through oxidation, is preferable in terms of the stable formation of the insulator (coating layer) that covers the fine particles, and preferable substances include tungsten, niobium, zirconium, titanium, chromium, tin, cobalt, nickel, iron, antimony and lead besides aluminum.

Although the thermal oxide on the silicon substrate has been given as the medium in which the fine particles are formed, other insulators of a glass substrate or the like or a semiconductor substrate or the like can also be employed.

Second Embodiment

According to a fine particle-containing body manufacturing method of a second embodiment, an etching process is provided between the process of forming the fine particles and the process of forming the coating layer in addition to the fine particle-containing body manufacturing method of the first embodiment, and a region from the surface of the medium in which the fine particles are formed to a prescribed depth is removed.

In the present embodiment, silver particles are formed as fine particles as in the first embodiment.

Figure 2A:
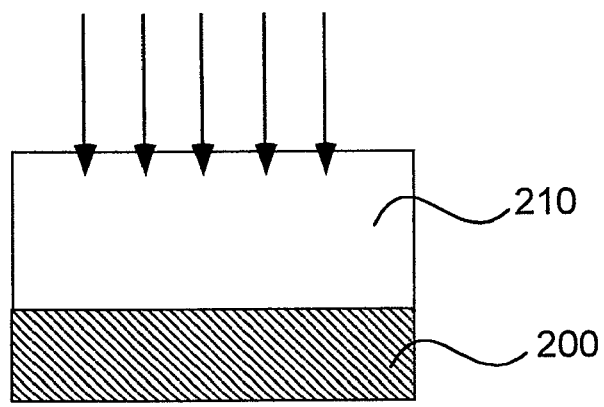
FIG. 2A is a view showing a process of a manufacturing method of a fine particle-containing body according to a second embodiment.

First of all, as shown in FIG. 2A, a silicon oxide 210 as the medium is formed on the surface of a silicon substrate 200 as the first layer through a thermal oxidation process. In the present embodiment, the film thickness is formed to about 100 nm.

Figure 2B:
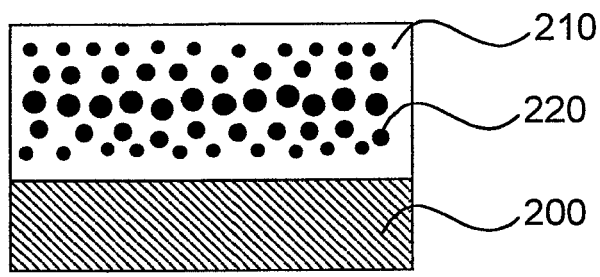
FIG. 2B is a view showing a process subsequent to the process of FIG. 2A.

Next, as shown in FIG. 2B, silver is introduced into the silicon oxide 210 by the ion implantation method. In this case, the implantation energy is set so that the implantation depth becomes about 50 nm.

Normally, an implantation profile is caused by the ion implantation, and the concentration of the implanted material comes to have a concentration profile similar to the Gaussian distribution in the depthwise direction with a maximum concentration set at a prescribed depth. In the present embodiment, the implanted silver comes to have the maximum concentration at a depth of about 50 nm away from the surface. Therefore, if fine particles 220 are formed as in the first embodiment, the fine particles 220 form a particle size distribution depending on the ion concentration. That is, fine particles 220 of a comparatively large particle size are formed at the depth at which the implantation concentration is maximum. Then, fine particles 220 of a comparatively small particle size are formed in positions above and below the position in which the fine particles 220 of a comparatively large particle size are formed.

Figure 2C:
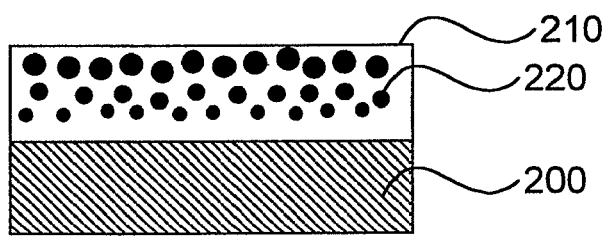
FIG. 2C is a view showing a process subsequent to the process of FIG. 2B.

In this case, a portion from the surface of the silicon oxide 210 to a prescribed depth is removed by etching in the present embodiment. As a result, the fine particles 220 of a comparatively large particle size are located in the neighborhood of the surface of the silicon oxide 210 as shown in FIG. 2C. Moreover, the fine particles 220 are made to have a particle size reduced from the location in the neighborhood of the surface of the silicon oxide 210 toward the substrate side. Both wet etching and dry etching can be used for the etching for removing the silicon oxide 210. In the present embodiment, wet etching was carried out by using a hydrofluoric acid solution of a concentration of 0.5%.

The thickness of the portion of the silicon oxide 210 to be removed by etching is made equal to or greater than the implantation depth of the substance for forming fine particles in the silicon oxide 210. In the present embodiment, etching was effected to a depth of about 50 nm from the surface.

Figure 2D:
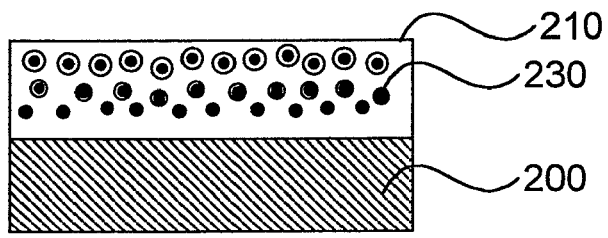
FIG. 2D is a view showing a process subsequent to the process of FIG. 2C.

Subsequently, the surface portions of the fine particles are reformed by, for example, thermal oxidation as in the first embodiment. As a result, silver oxide is formed on the surfaces of the silver particles as shown in FIG. 2D. In the insulating process, a load-lock type oxidation reactor produced by Hitachi Kokusai Electric Inc. was used. The silver fine particles tend to be oxidized by a greater degree as located closer to the surface of the silicon oxide 210, and the particle size is larger as located closer to the surface of the silicon oxide 210. Therefore, the particle size of the silver particles 230 after the formation of the silver oxide on the surfaces is varied comparatively less in the depthwise direction than the particle size of the silver particles 220 before the formation of the silver oxide.

After the silver particles 230 of which the surfaces are covered with the silver oxide are formed, a second layer is formed on the surface of the silicon oxide 210, completing the fine particle-containing body of the present invention.

The fine particle-containing body forming method of the present embodiment introduces silver that is the substance for forming the fine particles in the silicon oxide 210 as the medium and removes the portion to the prescribed depth from the surface of the silicon oxide 210 after the silver introducing process. As a result, a portion where the introduction density of the substance (silver) is comparatively low is removed. Therefore, the silicon oxide 210 is formed into a thin film, and the density of the silver particles 220 and 230 in the entire silicon oxide 210 can be increased. Moreover, the range of distribution of the silver particles 230 in the depthwise direction of the silicon oxide 210 can be narrowed.

Third Embodiment

The present embodiment has an etching process between the process of introducing a substance for forming fine particles and the heat treatment process for forming the fine particles. In the etching process, a region to a prescribed depth from the surface of an insulator, into which the substance for forming the fine particles has been introduced, is removed.

In the present embodiment, silver particles as the fine particles are formed in the silicon oxide as the medium. Moreover, the substance for forming the fine particles is introduced by ion implantation.

First of all, a silicon oxide 310 as the medium is formed on the surface of a silicon substrate 300 through a thermal oxidation process. In the present embodiment, the oxide is formed to a film thickness of about 100 nm. A portion, in which the silicon remains unoxidized, of the silicon substrate 300 becomes the first layer.

Figure 3A:
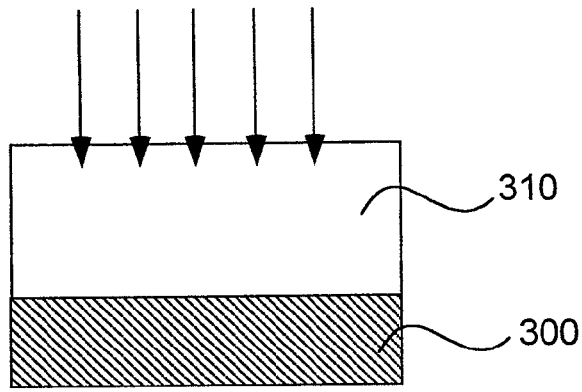
FIG. 3A is a view showing a process of a manufacturing method of a fine particle-containing body according to a third embodiment.

Next, as shown in FIG. 3A, silver is introduced into the silicon oxide 310 by the ion implantation method. In this case, the implantation energy is set so that the implantation depth becomes about 50 nm.

In this case, with regard to the implantation concentration of silver, a concentration profile similar to the Gaussian distribution is formed in the depthwise direction with a maximum concentration located at a depth of about 50 nm away from the surface of the silicon oxide 310.

Figure 3B:
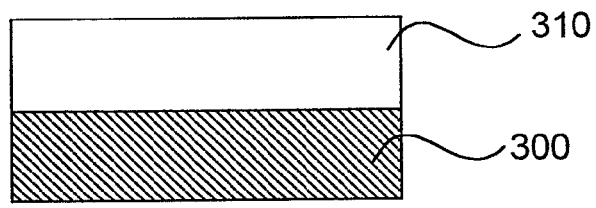
FIG. 3B is a view showing a process subsequent to the process of FIG. 3A.
Figure 3C:
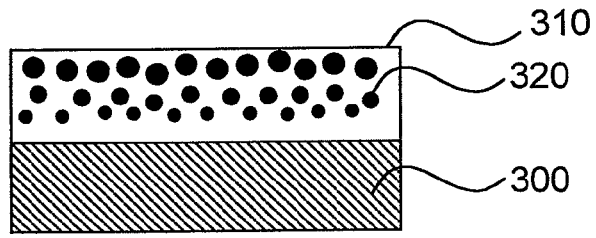
FIG. 3C is a view showing a process subsequent to the process of FIG. 3B.

Subsequently, as shown in FIG. 3B, a surface portion of the silicon oxide 310 is removed so that a portion of a high silver implantation concentration is located in the neighborhood of the surface. That is, the silicon oxide 210 is etched away in a range of a depth equivalent to or greater than the implantation depth. In the present embodiment, etching was effected to a depth of about 50 nm away from the surface. The etching method may be wet etching or dry etching as in the second embodiment. In the present embodiment, wet etching was carried out by using a hydrofluoric acid solution of a concentration of 0.5%.

Subsequently, heat treatment of the silicon oxide 310 and insulation of the silver particles are carried out as in the second embodiment.

First of all, by carrying out heat treatment of the silicon oxide 310, the silver particles 320 are formed distributed so that the particle size is reduced from a location in the neighborhood of the surface of the silicon oxide 310 toward the substrate 300 side.

Figure 3D:
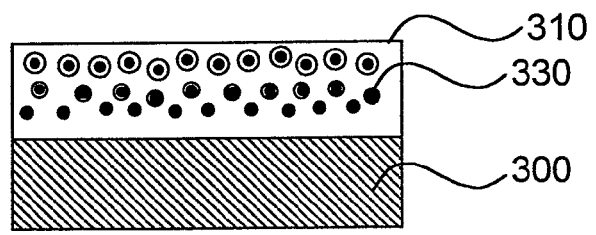
FIG. 3D is a view showing a process subsequent to the process of FIG. 3C.

Then, the surface portions of the silver particles are insulated by thermal oxidation. In the present embodiment, the load-lock type oxidation reactor produced by Hitachi Kokusai Electric Inc. was used. As a result, silver oxide is formed as a coating layer on the surfaces of the silver particles 330 as shown in FIG. 3D. The silver oxide is formed comparatively thick for the silver particles 330 located in the neighborhood of the surface of the silicon oxide 310 and comparatively thin on the silicon substrate 300 side, i.e., for the silver particles 330 located in positions remote from the surface of the silicon oxide 310. With this arrangement, the silver particles 330 after the formation of the coating layer came to have an approximately same particle size in the thickness direction of the silicon oxide 310. As a result, the silver particles 330 left uninsulated at the center of the silver particles 320 in the initial stage came to have a particle size distribution of a comparatively small variation in comparison with that of the silver particles 320 in the initial stage.

Although the implantation process, the heat treatment process and the insulating process were separately carried out in the first through third embodiments, the fine particles can be formed roughly concurrently with silver ion implantation carrying out no heat treatment depending on the implantation conditions. Moreover, the process of forming the coating layer, which is a process accompanied by heat like, for example, thermal oxidation, is also substantially able to concurrently serve as a particle formation process by heat treatment.

However, other conditions become severe in order to obtain fine particles of prescribed sizes, or the processes become unstable. Therefore, it is preferable to separately carry out the processes with regard to mass production.

The fine particle-containing body manufacturing method of the present embodiment has the process of removing the medium to the prescribed depth from its surface after the process of introducing the substance for forming fine particles. Therefore, the range of distribution in the depthwise direction of the substance can substantially be narrowed. Therefore, it becomes possible to narrow the range of distribution in the depthwise direction of the fine particles when the fine particles are formed from the substance.

Fourth Embodiment

In the present embodiment, a substance for forming fine particles is implanted into the substrate that is the precursor of the medium, and thereafter, the substrate is partially reformed. The substrate reforming process is carried out so as to effect the reforming to a location in the neighborhood of a region in which the implantation concentration of the substance is high. Subsequent to the substrate reforming process, etching is carried out by, for example, a solution in which the reformed substrate is dissolved, removing the reformed region. At this point of time, the portion where the implantation concentration of the substance is high appears on the surface. Then, the substrate, on the surface of which the portion where the implantation concentration of the substance is high has appeared, is subjected to heat treatment to diffuse or condense the implanted substance, forming prescribed fine particles at the point of time. Subsequently, the substrate reforming is carried out, forming the medium at the surface portion of the substrate and forming a coating layer at the surface portions of the fine particles.

FIGS. 4A to 4D are views showing processes of a manufacturing method of a fine particle-containing body according to a fourth embodiment.

Figure 4A:
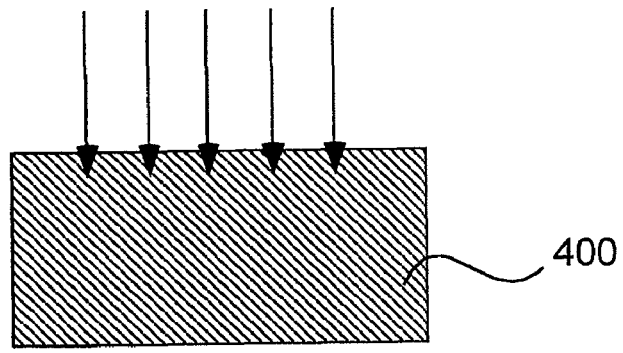
FIG. 4A is a view showing a process of a manufacturing method of a fine particle-containing body according to a fourth embodiment.

In the present embodiment, silver ions are implanted into a silicon substrate as the precursor of the medium in the absence of the silicon oxide or beyond a thin pad film unlike the first through third embodiments. That is, as shown in FIG. 4A, silver is introduced into the silicon substrate 400 by the ion implantation method. In this case, the implantation energy was set so that the implantation depth of silver ions became about 50 nm.

Also, in the process, the implantation concentration of the silver ions comes to have a concentration profile similar to the Gaussian distribution in the depthwise direction with the maximum concentration located at a depth of about 50 nm away from the surface of the silicon substrate 400 as in the first through third embodiments.

Figure 4B:
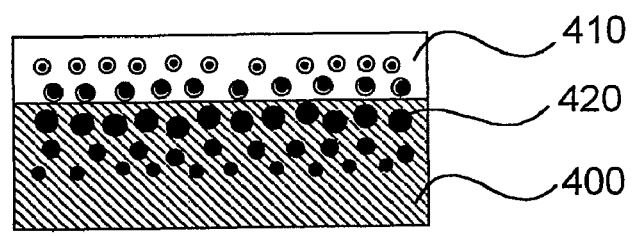
FIG. 4B is a view showing a process subsequent to the process of FIG. 4A.

Subsequently, a process for partially reforming the precursor is carried out by oxidation. That is, as shown in FIG. 4B, the silicon substrate 400 is partially oxidized to form a silicon oxide 410. The oxidation is carried out so that the portion where the implantation concentration of silver is high is located in the neighborhood of an interface between the silicon oxide 410 and the silicon substrate 400. That is, the oxidation depth of the silicon substrate 400 is made roughly equal to or greater than the implantation depth of silver. In the present embodiment, the oxidation was carried out to a depth of about 50 nm from the surface of the silicon substrate before oxidation. Silver particles 420 are formed by heat when the oxidation is carried out. It is noted that silver oxide is formed at the surface portions of the silver particles inside the silicon oxide 410 through the oxidation process.

Figure 4C:
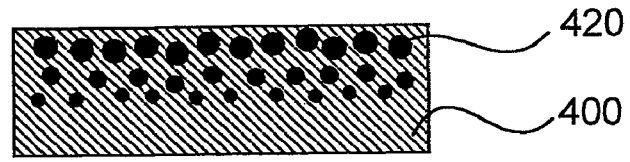
FIG. 4C is a view showing a process subsequent to the process of FIG. 4B.

Next, the silicon oxide 410 is removed. In the present embodiment, the silicon oxide 410 is removed by diluted hydrofluoric acid. As a result, as shown in FIG. 4C, the silicon substrate 400 after the removal of the silicon oxide 410 includes silver particles 420 of which the particle size is largest in the neighborhood of the surface and is reduced in the depthwise direction away from the surface of the silicon substrate 400.

Figure 4D:
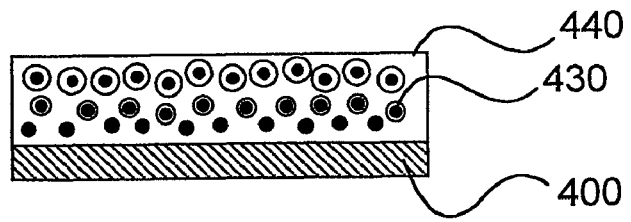
FIG. 4D is a view showing a process subsequent to the process of FIG. 4C.

Subsequently, the silicon substrate 400 is oxidized (reformed) again. The oxidation is carried out by the thermal oxidation method, by which a silicon oxide 440 of a film thickness of about 50 nm is formed on the surface of the silicon substrate 400. That is, the surface portion of the silicon substrate 400 is the precursor of the medium, and the precursor is oxidized to form the silicon oxide 440 as the medium. As a result, as shown in FIG. 4D, the surface portions of the silver particles 420 are also oxidized (reformed), so that silver particles 430, of which the surfaces were covered with the silver oxide, was formed. The particle size of the silver particles 430, of which the surfaces were covered with the silver oxide, had a distribution of a variation smaller than that of the silver particles 420 before the formation of the silver oxide as in the third embodiment.

By forming a second layer on the surface of the silicon oxide 440, the fine particle-containing body of the present invention is completed.

The fine particle-containing body manufacturing method of the present embodiment introduces the substance for forming the fine particles into the substrate as the precursor of the medium and thereafter removing the substrate from the surface of the precursor to the prescribed depth. Therefore, the range of distribution in the depthwise direction of the substance for forming the fine particles can substantially be narrowed. Therefore, it becomes possible to narrow the range of distribution in the depthwise direction of the fine particles when the fine particles are formed.

Fifth Embodiment

In the present embodiment, a control layer is preliminarily formed on a semiconductor substrate as a medium into which a substance for forming fine particles are implanted before the implantation of the substance.

Next, the substance is implanted into the semiconductor substrate beyond the control layer. At this time, the thickness and the implantation condition of the control layer are preparatorily set so that the neighborhood of an interface between the control layer and the substrate becomes a portion where the implantation concentration of the substance is high.

By carrying out heat treatment after the implantation of the substance, fine particles are formed of the substance. Subsequently, the control layer is removed. At this time, the fine particles formed in the control layer are removed at the same time.

Next, the surface portion of the substrate is reformed (insulated), and the surface portions of the fine particles are reformed (insulated). The degree of insulation of the fine particles is increased as the fine particles are located closer to the surface of the substrate. Since the diameter of the fine particles located in the neighborhood of the surface of the substrate is comparatively large, the diameter of the fine particles after insulation is varied comparatively less in the depthwise direction of the semiconductor substrate.

A concrete example of the present embodiment is described with reference to FIGS. 5A through 5D.

First of all, a silicon oxide 510 as the control layer is formed on the surface of a silicon substrate 500 as the precursor of the medium through a thermal oxidation process. The silicon oxide 510 is formed to a thickness of about 25 nm.

Figure 5A:
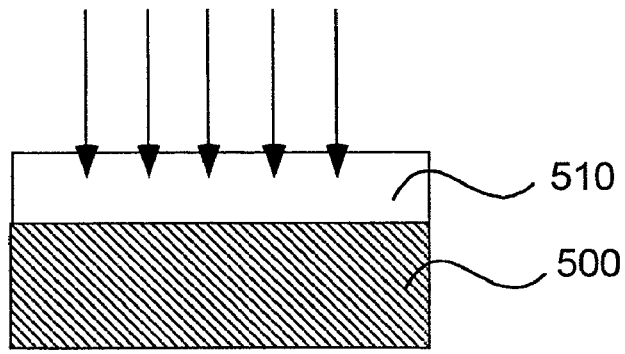
FIG. 5A is a view showing a process of a manufacturing method of a fine particle-containing body according to a fifth embodiment.

Next, as shown in FIG. 5A, silver is introduced into the silicon oxide 510 and the silicon substrate 500 by the ion implantation method. In this case, the implantation energy is set so that the implantation depth of silver becomes located in the neighborhood of an interface between the silicon oxide 510 and the silicon substrate 500. In the present embodiment, the implantation was carried out so that the implantation depth became about 50 nm.

Also, in the present embodiment, the implantation concentration of silver comes to have a concentration profile similar to the Gaussian distribution in the depthwise direction with the maximum concentration located at a depth of about 50 nm away from the surface of the silicon oxide 510 of the control layer.

Figure 5B:
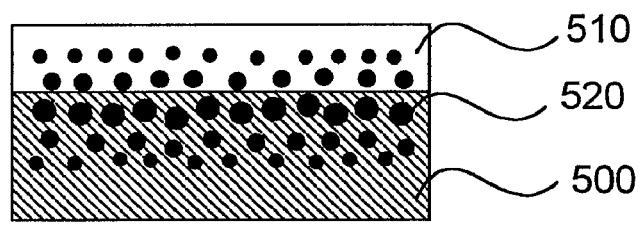
FIG. 5B is a view showing a process subsequent to the process of FIG. 5A.

Next, a heat treatment process is carried out to form silver particles 520. Although the state of formation of the silver particles 520 is different between the silicon oxide 510 and the silicon substrate 500 because of the difference of the base material, particle size distributions depending on the ion concentrations are formed in the respective base materials as shown in FIG. 5B.

Figure 5C:
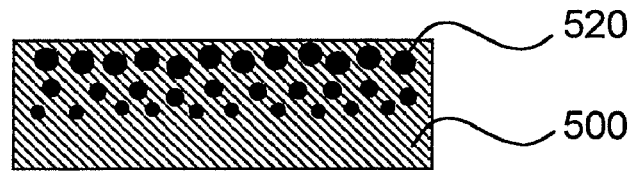
FIG. 5C is a view showing a process subsequent to the process of FIG. 5B.
Figure 5D:
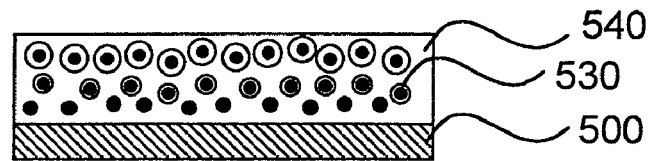
FIG. 5D is a view showing a process subsequent to the process of FIG. 5C.

In this case, the silicon oxide 510 as the control layer is removed by oxide etching. As the result of removing the silicon oxide 510, the surface of the silicon substrate 500 that is the precursor of the medium is exposed as shown in FIG. 5C. Silver particles 520 are distributed in the silicon substrate 500 so that the particle size is reduced in the depthwise direction away from the neighborhood of the surface.

Both wet etching and dry etching can be used for the oxide etching. In the present embodiment, wet etching was carried out by a hydrofluoric acid solution of a concentration of 0.5%.

Subsequently, the silicon substrate 500 and the surface portions of the fine particles are reformed through a thermal oxidation process as in the fourth embodiment. In the process, the load-lock type oxidation reactor produced by Hitachi Kokusai Electric Inc. was used. Through the thermal oxidation process, the surface portion of the silicon substrate 500 that is the precursor becomes a silicon oxide 540 that is the medium. The silicon oxide 540 was formed to a thickness of about 30 nm. Moreover, the surface portions of the silver particles in the silicon oxide 540 are reformed, and a silver oxide as the coating layer is formed. With regard to the silver particles 530, a silver oxide was formed thicker as located closer to the surface of the silicon oxide 540. In this case, the silver particles 530 located close to the surface of the silicon oxide 540 have a particle size, before the formation of the silver oxide, larger as located closer to the surface. Therefore, the particle size of the silver particles 530 after the formation of the silver oxide has reduced variation than before the formation of the silver oxide.

By forming the second layer on the surface of the silicon oxide 540, the fine particle-containing body of the present invention is completed.

Since the fine particle-containing body manufacturing method of the present embodiment forms the fine particles in the precursor of the medium and thereafter removes the part from the surface of the precursor to the prescribed depth. Therefore, it becomes possible to narrow the distribution range in the depthwise direction of the fine particles when fine particles are subsequently further formed.

Although the silicon oxide has been used as the control layer in the present embodiment, it is proper to use a substance of a resist, another oxide or nitride, polysilicon or the like, so long as the substance has a property different from that of the precursor of the medium. That is, the control layer is only required to have a sufficient selection ratio to the precursor in the removal process.

Sixth Embodiment

In the present embodiment, the process of removing the control layer and the heat treatment process are varied in order with respect to those of the fifth embodiment.

That is, in the present embodiment, a substance for forming fine particles is implanted in the precursor of the medium via the control layer, the control layer is subsequently removed, and thereafter heat treatment is carried out to form fine particles. Subsequently, an insulating process is carried out to reform (insulate) the surface portion of the precursor and reform (insulate) the surface portions of the fine particles.

FIGS. 6A to 6D are views showing processes of the manufacturing method of the fine particle-containing body according to the present embodiment.

First of all, a silicon oxide 610 as the control layer is formed on the surface of the silicon substrate 600 by thermal oxidation. In the present embodiment, the control layer was formed to a thickness of about 25 nm.

Figure 6A:
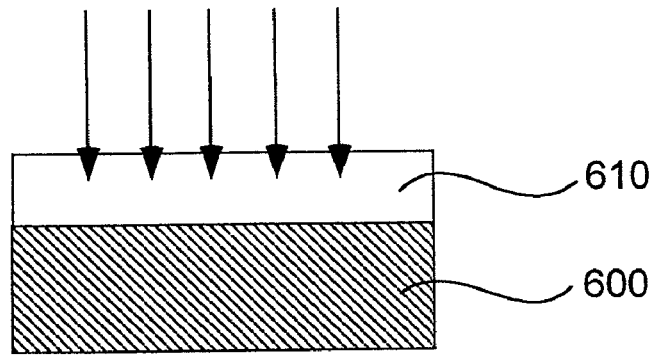
FIG. 6A is a view showing a process of a manufacturing method of a fine particle-containing body according to a sixth embodiment.

Next, as shown in FIG. 6A, silver is introduced into the silicon oxide 610 and a silicon substrate 600 that is the precursor of the medium located under the silicon oxide 610 by the ion implantation method. In this case, the implantation energy is set so that the maximum implantation depth becomes located in the neighborhood of an interface between the silicon oxide 610 and the silicon substrate 600. In the present embodiment, the implantation depth was set to about 50 nm.

The implantation concentration of silver comes to have a distribution similar to the Gaussian distribution such that the maximum concentration is located at a depth of about 50 nm away from the surface of the silicon oxide 610.

It is sometimes the case where silver particles are formed in the silicon oxide 610 and the silicon substrate 600 at a point of time when silver ions are implanted depending on conditions.

Figure 6B:
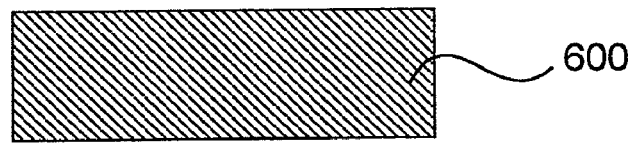
FIG. 6B is a view showing a process subsequent to the process of FIG. 6A.

Next, as shown in FIG. 6B, the silicon oxide 610 as the control layer is removed by oxide etching to expose the surface of the silicon substrate 600 as the precursor of the medium, and a portion where the implantation concentration of silver is high is located in the neighborhood of the surface. Both wet etching and dry etching can be used for the etching. In the present embodiment, the control layer to be removed was silicon oxide, and therefore, wet etching by a hydrofluoric acid solution of a concentration of 0.5% was carried out.

Subsequently, heat treatment and an oxidation process are carried out.

Figure 6C:
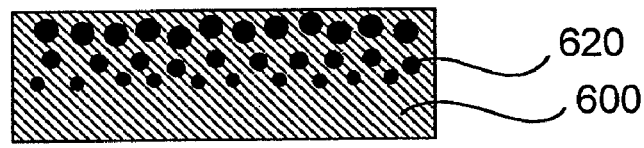
FIG. 6C is a view showing a process subsequent to the process of FIG. 6B.

First of all, by carrying out heat treatment, silver particles 620 are formed in the silicon substrate 600 as shown in FIG. 6C. The silver particles 620 are formed so that the particle size is reduced in the depthwise direction away from the neighborhood of the surface of the silicon substrate 600.

Figure 6D:
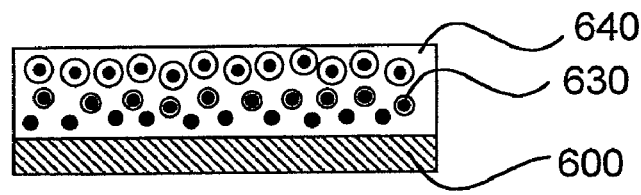
FIG. 6D is a view showing a process subsequent to the process of FIG. 6C.

Then, a process for reforming (insulating) the precursor and the surface portions of the fine particles is carried out by thermal oxidation. In the present embodiment, the load-lock type oxidation reactor produced by Hitachi Kokusai Electric Inc. was used. As a result, as shown in FIG. 6D, a silicon oxide 640 of a thickness of about 30 nm is formed at the surface portion of the silicon substrate 600. Moreover, a comparatively thick silver oxide is formed on the surfaces of the silver particles 630 in the neighborhood of the surface of the silicon oxide 640. Then, the silver oxide formed on the surfaces of the silver particles 630 has a thickness thinner toward the depthwise direction of the silicon oxide 640. As a result, the silver particles 630 after the insulation were formed with a comparatively small variation in the particle size in the depthwise direction of the silicon oxide 640 in comparison with the silver particles 620 before the insulation.

By forming a second layer on the surface of the silicon oxide 640, the fine particle-containing body of the present invention is completed.

Although the silicon oxide was used as the control layer, the control layer may be anything so long as it is able to control the amount of introduction of the substance for forming the fine particles and to be removed after the introduction of the substance. For example, it is acceptable to constitute the control layer of, for example, an SiN film and remove the control layer by phosphoric acid in the removal process.

Although silver was used as the second material for forming the fine particles in the first through sixth embodiments, it is also acceptable to use other metals of, for example, gold, copper, aluminum, tin, nickel, platinum, zinc, hafnium, manganese, tantalum, titanium, tungsten and indium other than silver.

In particular, a substance that forms a fine oxide on the surface like aluminum, which can cover the fine particles with an insulator (coating layer) with few defects, is able to effectively suppress the electric charge leakage phenomenon when electric charge is retained in the aluminum fine particles. Therefore, a fine particle-containing body with an excellent charge retention characteristic can be formed.

Otherwise, when a material capable of obtaining an insulator of a high dielectric constant by insulation like hafnium (hafnium oxide in the case of hafnium) is employed as the second material for forming the fine particles, the fine particles can be covered with the insulator of a high dielectric constant. With this arrangement, when an electric charge is retained in the fine particle, the magnitude of the Coulomb force depending on the presence or absence of an electric charge can effectively be given to the outside. Moreover, the electric field can be exalted in the insulator of the high dielectric constant, and therefore, an electric charge can efficiently be put in and out of the fine particle. Therefore, a memory function body of excellent operation characteristics can be formed. For example, if the fine particles are used for the floating gate of, for example, a memory transistor, a memory window can be enlarged. Therefore, a memory transistor of high reliability can be constituted.

Moreover, it is also possible to use a semiconductor of silicon, germanium or the like or an alloy or a compound other than the semiconductor for the fine particles.

In particular, when silicon is used for the fine particles and the coating layer is formed of a silicon oxide or a silicon nitride by insulating the surface portions of the silicon fine particles by oxidation or nitriding, the coating layer can function as a barrier effective against the electric charge retained in the silicon fine particles. That is, a memory function body, which has scarce electric charge leakage and has a satisfactory retention characteristic, can be formed.

Moreover, since the silicon substrate 600 is used as the first layer and the silicon oxide or the silicon nitride is used as the first material that forms the medium, the fine particle-containing body can be formed by using the existing semiconductor manufacturing equipment. Therefore, the fine particle-containing body can be manufactured comparatively easily at low cost. Moreover, consolidation with other elements can easily be achieved, and high versatility and practicability are obtained.

Moreover, the fine particle-containing body manufacturing method of the present embodiment forms the control layer on the precursor of the medium. Therefore, after the introduction of the substance for forming the fine particles into the precursor, the layer to be removed can be removed with a small variation in thickness in the process of removing the control layer.

Seventh Embodiment

In the present embodiment, when the substance for forming the fine particles is introduced into the control layer and the medium precursor by ion implantation, it is different from the sixth embodiment that the implantation is carried out from the direction that makes an acute angle to the surface of the control layer. That is, the ion implantation is carried out at an implantation angle of not smaller than zero degrees and not greater than 90 degrees with respect to the surface of the control layer.

In concrete, the silver negative ions are implanted into the silicon substrate as the precursor of the medium and the silicon oxide as the control layer formed on the silicon substrate making an implantation angle of about 70° with respect to the normal line of the surface of the silicon oxide. The silicon oxide has a thickness of about 100 nm. The implantation condition of the silver negative ions is roughly similar to that of the sixth embodiment.

Subsequently, as the result of carrying out the process of removing the control layer, the process of forming the silver particles by heat treatment and the process of forming the medium (silicon oxide) by thermal oxidation as in the sixth embodiment, the silver particles were formed distributed in a region narrower than that of the sixth embodiment in the depthwise direction of the silicon oxide. In the present embodiment, the silver particles were able to be formed in a region of a thickness of about a half of that of the sixth embodiment.

In this case, by the implantation method using positive ions, the insulator of the silicon oxide or the like subjected to the implantation is disadvantageously electrified, frequently causing a case where the implantation profile of silver ions is expanded or a case where the desired implantation depth cannot be obtained even if the silver ions are implanted at an acute angle. In contrast to this, since the negative ion implantation method is used in the present embodiment, the silicon oxide or the like is not electrified with a high voltage, and the implanted silver ions can be distributed in conformity to the setting. As a result, the fine particles can be formed with a comparatively narrow width of distribution at the desired depth. Therefore, even if the silicon oxide as, for example, the control layer formed on the silicon substrate as the precursor is formed into a thin film, the implantation of the silver ions can be stopped within the region of the precursor of the silicon substrate, making it possible to avoid the disadvantage that the silver ions are implanted to the region that becomes the first layer of the silicon substrate.

As the result of forming the silver particles via the control layer obtained by forming the silicon oxide into a thin film of a film thickness of about 50 nm on similar conditions, the silver particles were able to be accurately formed throughout the region at the prescribed depth in the precursor of the silicon substrate as in the case where the control layer of a silicon oxide of a thickness of 100 nm was employed. Moreover, by reducing the implantation energy to a low energy or increasing the implantation angle to the surface of the silicon oxide to a high angle, it becomes possible to employ a silicon oxide further reduced in thickness.

Since the implantation efficiency is reduced when the implantation angle of the substance for forming the fine particles is comparatively large, it is preferable to set the angle not greater than 80 degrees with respect to the normal direction of the surface subjected to the implantation.

Eighth Embodiment

In the present embodiment, the surface of the medium is etched while implanting the substance for forming fine particles into the medium that retains the fine particles. For example, the silicon oxide is etched while implanting silver ions into the silicon oxide formed on a silicon substrate.

Figure 7A:
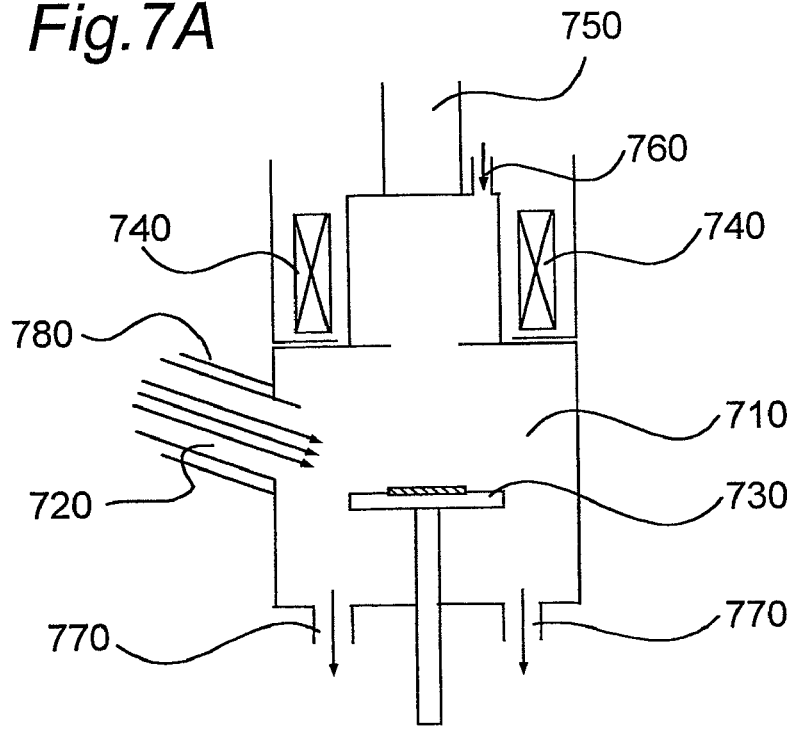
FIG. 7A is a schematic view showing an apparatus for implanting a fine particle material into a medium.
Figure 7B:
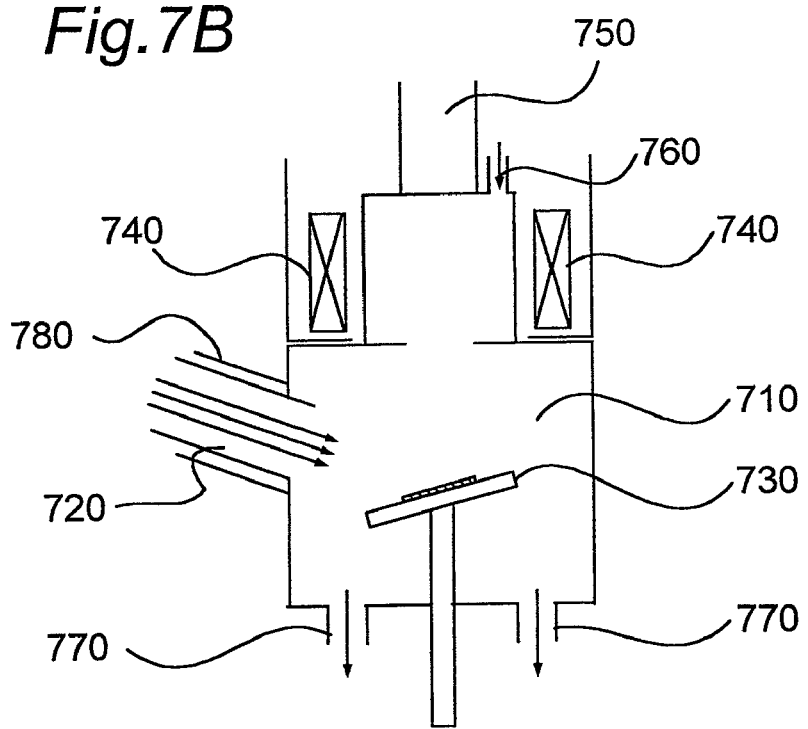
FIG. 7B is a schematic view showing an apparatus for implanting a fine particle material into a medium.

FIGS. 7A and 7B are schematic views showing apparatuses for implanting a fine particle material into a medium. As shown in FIGS. 7A and 7B, the apparatus has a structure in which a reaction chamber 710 of a dry etching apparatus is provided with an outlet port of a beam transport part 720 of an ion implanter, making the chamber concurrently serve as the implantation chamber of the ion implanter. The dry etching apparatus has a coil 740, a microwave waveguide 750, an etching gas introducing tube 760 and vacuum outlet ports 770. Moreover, the present apparatus has a magnetic shield 780 provided around the beam transport part 720 to prevent the ion beam from being influenced by the external magnetic fields from the coil 740 and the like.

Moreover, the present embodiment, in which ions for forming the fine particles are implanted tilted to the medium, has a structure in which an ion implantation direction has an angle of about 70° with respect to the normal line of the substrate holding base 730 as shown in FIG. 7A. Moreover, it is also possible to set the implantation direction of the conductor ions in the desired direction by changing the direction in which the beam transport part 720 is attached or providing the beam transport part 720 with a beam path changing mechanism.

Otherwise, by changing the tilt of the substrate holding base 730 with a movable mechanism provided for the substrate holding base 730, the direction of implantation to the medium on the substrate or the like can be arbitrarily set. FIG. 7B is a view schematically showing a state in which only the substrate holding base 730 is tilted by an angle of about 15° from the state of FIG. 7A. Therefore, the conductor ion implantation angle becomes about 55° in the state of FIG. 7B.

In this case, silver negative ions were implanted by about $1 \times 10^{15}/cm^2$ into the silicon oxide as the medium that has been formed on the silicon substrate to a film thickness of about 40 nm with an implantation energy of about 30 KeV by means of the apparatus of FIG. 7A. Also, the silicon oxide was etched at a constant rate by about 10 nm by dry etching. In the present embodiment, the mean current density of the beam was about 1 $\mu A/cm^2$, and the etching rate was about 4 nm/min.

Subsequently, heat treatment was carried out by a method similar to that of the first through sixth embodiments to form fine particles in the medium. In the first through sixth embodiments, fine particles of the largest particle size were formed at the prescribed depth away from the surface of the silicon oxide as the medium, and fine particles of a particle size smaller than the particle size were formed above and below the prescribed depth. Moreover, the fine particle density tended to become nonuniform in the film thickness direction of the silicon oxide as the medium. However, in the present embodiment, a distribution of silver particles comparatively uniform to a depth of about 10 nm away from the surface of the silicon oxide as the medium was obtained, and the variations in the size and the density of the fine particles were reduced.

Moreover, since the tilt implantation for implanting the fine particle material from the direction at an acute angle to the surface of the medium is carried out in the present embodiment, the region in which the fine particles are formed can be set within a narrow range in the film thickness direction of the medium. Moreover, if the implantation angle of the fine particle material is adjusted, the range in which the fine particles are formed in the medium can be adjusted. Further, it becomes possible to further control the variation in the range in which the fine particles are formed by using negative ions as in the present embodiment, the range in which the fine particles are formed can be adjusted with a satisfactory accuracy.

Moreover, since the variations in the size and the density of the fine particles in the medium can be reduced, the density of the particle size corresponding to the depth of the medium can uniformly be formed in the direction of the plane of the medium. Therefore, the charge retention characteristic can be uniformed in the direction of the plane of the medium.

Further, by carrying out the process of insulating the fine particles, the particle size of the fine particles can be reduced as in the other embodiments, and the charge retention characteristic of the fine particles can be improved. In particular, the fine particles can be formed in the narrow range in the film thickness direction of the medium in the present embodiment, and therefore, the medium can be formed into a thin film. Moreover, since the fine particles can be formed within the narrow range in the thickness direction of the thin film, it is possible to form the coating layer by insulating the surface portions of almost all the fine particles in a short time and to shorten the time of the insulating process. Moreover, since the variation in the insulation of the surface portions of the fine particles can be suppressed, the reliability and productivity can be improved.

Although the ion implantation into the silicon oxide as the medium has been carried out in the present embodiment, it is acceptable to form the control layer on the surface of the precursor of the medium and carry out ion implantation into the precursor via the control layer.

Ninth Embodiment

In the present embodiment, a memory function body was formed by forming a fine particle-containing body including nanometer-size fine particles by the fine particle-containing body manufacturing method of the present invention.

Figure 8A:
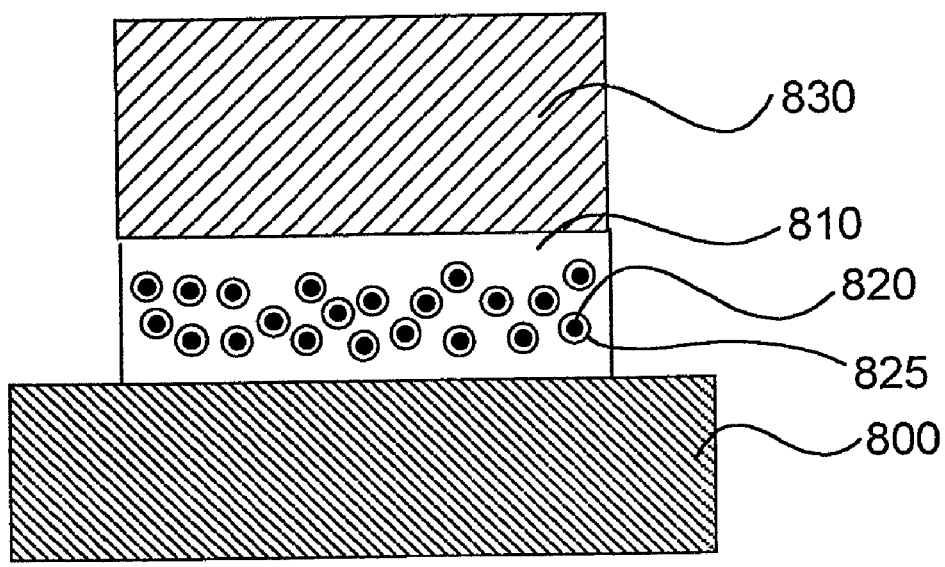
FIG. 8A is a schematic view showing a memory function body that employs the fine particle-containing body of the embodiment.
Figure 8B:
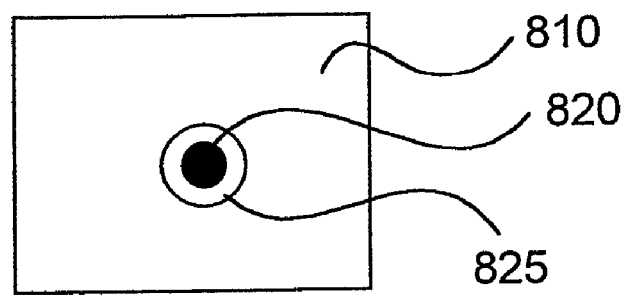
FIG. 8B is an enlarged view showing part of FIG. 8A.

FIG. 8A is a schematic view showing the memory function body that employs the fine particle-containing body of the embodiment. FIG. 8B is an enlarged view showing part of FIG. 8A. The memory function body has a silicon oxide 810 as the medium on a substrate 800 as the first layer, and silver particles 820 covered with a silver oxide 825 as the coating layer is formed in the silicon oxide 810. An electrode 830 as the second layer formed of aluminum is provided on the silicon oxide 810.

Figure 9:
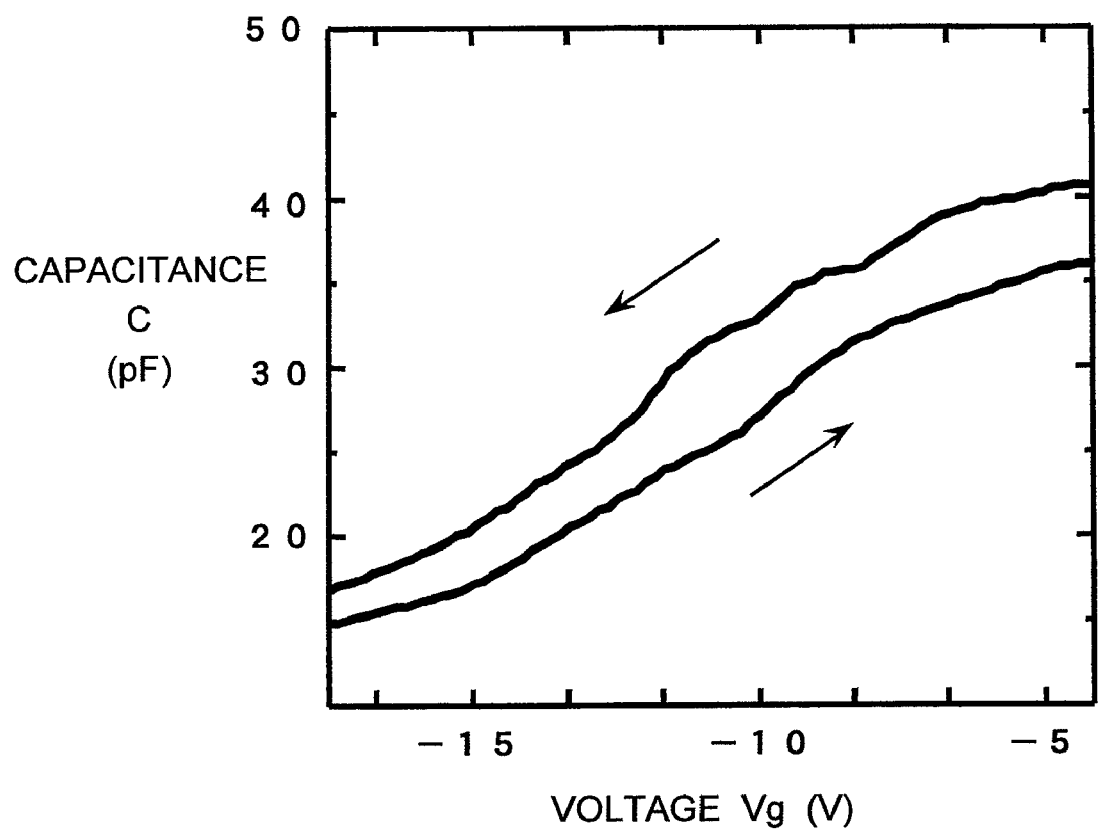
FIG. 9 is a graph showing changes in capacitance with respect to changes in the voltage applied to the memory function body.

As the result of carrying out experiment by measuring a capacitance C of the silicon oxide 810 when a voltage Vg was applied between the silicon substrate 800 and the aluminum electrode 830 of the memory function body, curves as shown in FIG. 9 were obtained. In FIG. 9, the horizontal axis represents the voltage Vg (V), and the vertical axis represents the capacitance C (pF). As is apparent from FIG. 9, the memory function body exhibits a hysteresis characteristic. As described above, the silicon oxide 810, which includes the nanometer-size silver particles 820 of the present embodiment, has the hysteresis characteristic. Therefore, by a comparison of the magnitude of the capacitance when same voltage is applied between the silicon substrate 800 and the aluminum electrode 830, binary value distinction can be achieved to allow a memory function to be produced.

Moreover, according to the fine particle-containing body of the present embodiment, silver particles 820 covered with a silver oxide 825 are formed by introducing a substance for forming fine particles into the medium by negative ion implantation, forming fine particles by heat treatment and thereafter reforming the surface portions of the fine particles through an insulating process. Therefore, the silicon oxide 810 as the medium suffers a little damage since the substance is introduced by the negative ion implantation and has a quality equivalent to that of a single thermal oxide. Therefore, the memory function body has very high reliability. Moreover, the memory function body has excellent productivity since a time required for the manufacturing is shorter than in the case where the insulator and the fine particles are formed by, for example, the CVD method.

Moreover, by implanting, for example, hydrogen or other molecules in the process of reforming the surface portions of the silver particles, defects of dangling bond and the like existing on the surfaces of the silver particles are terminated, allowing the defects to be reduced. As a result, silver particles 820, which have satisfactory surfaces with, for example, a reduced amount of interface states, are obtained.

Moreover, the silicon oxide as the third material for forming the silver oxide 825 as the coating layer has the insulated silver as the second material for forming the silver particles 820. Therefore, interfaces between the silver oxide 825 and the silver particles 820 come to have a satisfactory state with a comparatively reduced amount of interface states. Therefore, the silver particles 820 have the retained electric charge leakage reduced further than in the conventional case, so that a memory function body capable of retaining an electric charge for a time longer than in the conventional case can be achieved.

Moreover, since the silver oxide as the third material is obtained by oxidizing silver as the second material, the fine particle-containing body can be manufactured by using the existing oxidation reactor or the like widely used in the semiconductor industry. This therefore obviates the need for new manufacturing equipment for the fine particle-containing body, allowing the investment cost for the equipment to be reduced for the obtainment of an inexpensive memory function body.

Moreover, silver ions as the substance are implanted into the silicon oxide 810 as the medium by the negative ion implantation. Therefore, the variation in the formation position of the silver particles by electrification can be suppressed, and the silicon oxide 810 including the silver particles can be formed into a thin film and scaled down in size. Further, the effective electric field applied to the silicon oxide 810 is strengthened due to the comparatively small thickness even if same voltage is applied between the electrodes in comparison with the case where the thickness is comparatively great. Therefore, the memory function body is allowed to have a low operation voltage, so that the productivity and low power consumption property can be improved.

Moreover, by implanting the silver ions at an acute angle with respect to the surface of the silicon oxide 810 during the silver ion implantation, the spread of the distribution of the silver particles 820 in the thickness direction of the silicon oxide 810 can be suppressed. Therefore, the silicon oxide 810 can be formed into a thin film, and the scale-down can effectively be achieved.

With regard to the thickness of the silicon oxide 810, a sample of which the thickness was increased to 70 nm by increasing only the silicon oxide by employing the silicon oxide 110 of the first embodiment was formed, and a potential difference was applied to the sample to carry out an experiment. As a result, the film of the sample did not operate as a memory function body unless the potential difference was raised to about 10 V. Moreover, if the potential difference of 10 V was given, dielectric breakdown disadvantageously occurred. Therefore, the thickness of the silicon oxide 810 should preferably be smaller than 70 nm.

Moreover, if the memory function body of the present embodiment is used for the capacitor of the conventional DRAM (Dynamic Random Access Memory), a DRAM that requires no refresh or is able to largely reduce at least the refresh frequency can be provided. Moreover, since there is no need to use a special material like a ferroelectric substance for a ferroelectric memory, a DRAM that can be fabricated through simple processes and has excellent productivity can be obtained.

With regard to the size of the silver particle 820, the scale-down becomes difficult when the size is excessively large, and the memory function is degraded when the size is excessively small. Therefore, a nanometer size, i.e., a size smaller than 1 μm is preferable, and it is particularly preferable that silver particles 820 included in the particle size range of not smaller than 0.1 nm and not greater than 4 nm form a majority.

Moreover, semiconductors of polysilicon and the like other than metal can be used for the electrode 830 so long as the substance is a conductive substance. Moreover, the silicon substrate 800 as the first layer may be provided by another substance so long as the substrate has an electrical conductivity.

Although the case where the silver particles 820 as the fine particles covered with the silver oxide 825 have been formed in the silicon oxide 810 as the medium in the present embodiment has been described, the fine particles may be formed of another substance of gold, copper, silicon, germanium, aluminum, tungsten, niobium, zirconium, titanium, chromium, tin, cobalt, nickel, iron, antimony, lead or the like. The fine particles should properly be formed so as to be covered with an insulator (coating layer) obtained by oxidizing the fine particles according to the material of the fine particles.

Moreover, although the oxide obtained by oxidizing the surface portions of the fine particles has been employed as the coating layer, a nitride film obtained by nitriding the surface portions of the fine particles may be employed. Since the coating layer can be formed on the surface portions of the fine particles by using the existing semiconductor manufacturing equipment even if a nitride film is employed as the coating layer, the fine particle-containing body can be formed comparatively easily at low cost.

Moreover, the medium (insulator) that retains the fine particles and the insulator is not limited to the silicon oxide but allowed to be formed of a silicon nitride, a glass substrate, another semiconductor or the like.

Moreover, the fine particles are sometimes formed roughly simultaneously with the implantation even if the process of forming the fine particles such as heat treatment is not carried out depending on the implantation condition of silver ions. If the dimensions and so on of the fine particles satisfy prescribed requirements, the implantation process can concurrently serve as the particle formation process, so that the number of processes can be reduced. Moreover, a heat treatment effect is sometimes obtained when, for example, heat is applied in the process of reforming the silver particles. In the case, the reforming process can concurrently serve as the particle formation process, so that the number of processes can be reduced.

Tenth Embodiment

In the present embodiment, a fine particle-containing body is formed of a material different from that of the ninth embodiment, and a memory function body is formed. That is, silicon is implanted into a silicon thermal oxide as the medium in place of silver by an implantation dose of $1 \times 10^{15}$ to $1 \times 10^{16}/cm^2$ under implantation energy of 10 to 15 KeV. Then, heat treatment is carried out in a nitriding atmosphere, forming SiN/Si fine particles by covering the surfaces of silicon fine particles with SiN as the coating layer. The heat treatment is carried out for several hours in an ammonia atmosphere at a temperature of about 900° C.

It was discovered that the memory function body formed in the present embodiment had a hysteresis larger than that of the memory function body produced by forming silicon fine particles by the conventional CVD (i.e., memory window is large) and was also excellent in the charge retention characteristic. This is ascribed to the fact that the insulator, which becomes the medium including the fine particles, is the silicon thermal oxide having a quality better than that of the oxide of the CVD film or polysilicon. Moreover, formed on the surfaces of the silicon fine particles is not the SiN film formed by CVD but the SiN film formed through an annealing process. Therefore, excellent characteristics capable of reducing the amount of interface states to be formed between the silicon fine particles and the SiN film and having a reduced leakage of the retained electric charge.

Moreover, SiN as the third material for forming the coating layer is the silicon nitride, which has a high dielectric constant. Therefore, the electric field intensity when the voltage is applied can be increased, and an electric charge can efficiently be put in and out of the silicon fine particles. Moreover, since SiN is the substance frequently used in the semiconductor industry and formable by using the existing semiconductor manufacturing equipment, the coating layer can be formed comparatively easily at low cost.

Eleventh Embodiment

In the present embodiment, a fine particle-containing body is formed of a material different from that of the ninth embodiment, and a memory function body is formed. That is, conductive fine particles are formed of aluminum in place of silver. Aluminum is implanted into a silicon oxide as the medium by an implantation dose of about $1 \times 10^{14}$ to $1 \times 10^{16}/cm^2$ with implantation energy of 5 to 15 KeV, and heat treatment is carried out as in the tenth embodiment. The heat treatment temperature is not higher than 600° C. As a result, a memory function body having a silicon oxide, in which $Al_2O_3/Al$ fine particles obtained by covering the surfaces of the fine particles with alumina discretely existed, was able to be manufactured.

The memory function body of the present embodiment has a hysteresis larger than that of the memory function body having fine particles produced by the conventional method (i.e., memory window is large) and also has an excellent charge retention characteristic. This is ascribed to the fact that the conductive fine particles have excellent charge storage capabilities because the metal of aluminum is used for the conductive fine particles and have excellent charge retention capabilities because they are enclosed by alumina that is an excellent insulator. Moreover, the alumina is in the so-called passive state, and oxidation is scarcely promoted after alumina is formed by oxidation on the surfaces of the aluminum fine particles. Therefore, the characteristics relevant to the electric charge scarcely change. As a result, a highly reliable memory function body, which is able to perform stable memory operation because the characteristics scarcely change with the lapse of time, can be provided.

Twelfth Embodiment

In the present embodiment, conductive fine particles were formed by a method different from that of the eleventh embodiment. That is, a solid phase diffusion method was used as a method for introducing a substance for forming conductive fine particles in the medium instead of the ion implantation method. For example, a case where aluminum fine particles are formed in the silicon oxide as the medium as in the eleventh embodiment is described.

First of all, a silicon oxide as the medium is formed as in the first embodiment. An aluminum film is formed by depositing aluminum on the silicon oxide by means of a vacuum evaporator. A sputtering method may be used instead of the evaporation method, and any method may be used so long as an aluminum film can be formed.

Subsequently, heat treatment was carried out at a temperature of about 400° C. to 600° C., so that aluminum was diffused from the aluminum film into the silicon oxide as the medium. Subsequently, fine particles were formed by carrying out heat treatment at a temperature lower than a temperature at which the diffusion is carried out, and thereafter, a coating layer was formed on the surface portions of the fine particles by oxidation.

Subsequently, an electrode as the second layer was formed as in the eleventh embodiment to form a fine particle-containing body. It was discovered that the fine particle-containing body had excellent memory characteristics as in the eleventh embodiment.

According to the present embodiment, a memory function body of excellent characteristics can be formed by using the diffusion method more easily than by the ion implantation method.

It is more preferable to form an AlSi film in place of the aluminum film on the surface of the silicon oxide as the medium since the neighborhood of the surface of the silicon oxide can be prevented from having a very high concentration. Moreover, if a material whose oxide forms a passive state as represented by aluminum is employed as fine particles, the material is advantageous since the surfaces of the fine particles can be covered with an insulator of a good quality by oxidation.

As described above, in the present embodiment, the substance for forming the fine particles can be diffused by a large amount into the medium through a small number of processes by the solid phase diffusion method. Moreover, the solid phase diffusion method, which can be carried out by a comparatively simple apparatus, is able to comparatively easily form a large number of fine particles in the medium.

It is noted that the fine particles are sometimes formed roughly simultaneously with the diffusion depending on the conditions of the solid phase diffusion even if the process of heat treatment or the like for forming fine particles is not used. If the fine particles satisfy the requirements of the prescribed dimensions and so on, the diffusion process can concurrently serve as the process of forming fine particles. Otherwise, when, for example, heat is applied in the reforming process of the surface portions of the fine particles, a heat treatment effect for forming fine particles is sometimes obtained. In the case, the particle formation process and the reforming process can be carried out in one process.

Thirteenth Embodiment

In the present embodiment, a storage element is formed by employing a fine particle-containing body formed on a semiconductor substrate. That is, nanometer-size conductive fine particles manufactured by the particle formation method of the present invention are formed in an insulator on the semiconductor substrate, and an electrode is further formed on the insulator by a normally used method. A substance of a metal, polysilicon or the like can be used for the electrode so long as the substance is a conductive substance. Source and drain regions were formed in the semiconductor substrate by a method used for the manufacturing of a transistor of a flash memory and the like, constituting a field effect transistor for the manufacturing of a storage element of the present invention.

Figure 10:
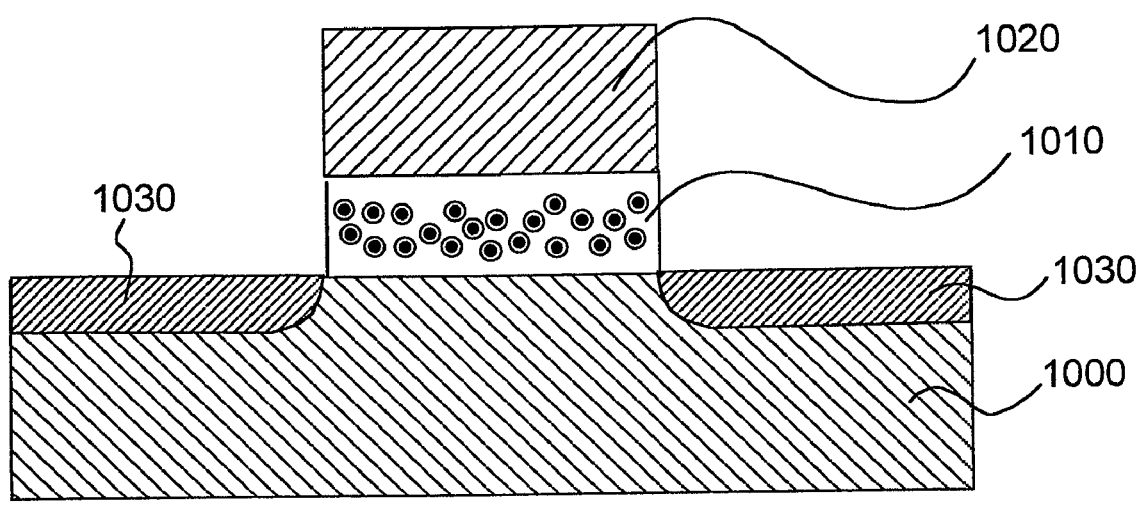
FIG. 10 is a schematic view showing a storage element of a thirteenth embodiment.

FIG. 10 is a schematic view showing the storage element of the present embodiment. A silicon oxide 1010 as the medium is formed on a silicon substrate 1000, and silver particles covered with a silver oxide as the coating layer are formed in the silicon oxide 1010. An aluminum film is formed on the silicon oxide 1010, and a gate electrode 1020 as the second layer is formed from the aluminum film by photolithography and etching. Then, source/drain regions 1030 are formed in the silicon substrate 1000 by the normal ion implantation method. The source/drain regions 1030 have electrical conductivity and functions as the first layer of the fine particle-containing body. Further, an interconnection process is carried out by a normal method, forming a transistor.

The storage element manufactured in the present embodiment obtained a threshold magnitude varied in correspondence with the magnitude of the capacitance described in connection with the ninth embodiment. That is, in order to execute write and erase, a sufficiently large positive or negative voltage is applied to the gate electrode 1020 as in the floating gate type memory. In order to execute read, it is proper to detect a current that flows between the source and drain 1030. In the storage element of the present embodiment, a difference of about 2 V was caused in the threshold value between immediately after the application of +15 V and immediately after the application of −15 V to the gate electrode 1020. Therefore, the storage device of the present embodiment can execute memory operation similar to that of the flash memory and the like.

Moreover, the silicon oxide 1010, which can be formed into a thin film, can be scaled down in size and operable with a low voltage. Furthermore, since no complicated process like that of the flash memory is needed and no special material like that of the ferroelectric memory is employed, excellent productivity is possessed.

Moreover, the silver particles of the fine particle-containing body contained in the storage element are covered with the oxide that has an electrical insulation property. Therefore, the charge retention characteristic of the tree fine particles can be improved, by which the storage retention characteristic of the storage element can be improved.

Moreover, since the silver particles have electrical conductivity, the amount of charge that can be retained per unit volume in the silver particles can be increased. Therefore, even if there is some change in the amount of charge that the silver particles retain, a ratio of change with respect to the whole amount of charge is reduced, and therefore, the storage retention characteristic of the storage element can be stabilized.

Moreover, since the silicon oxide 1010 and the silver oxide are mutually different insulators, the inflow or outflow of an electric charge to and from the inside of the silver particles can effectively be suppressed. Therefore, the characteristics of the storage element can be stabilized.

Moreover, since the silver oxide as the coating layer is obtained by making insulative silver that is the material of the fine particles, the interface between the silver oxide and the silver particle can be put into a satisfactory state in which the interface states are comparatively reduced. Therefore, a storage element capable of reducing the leakage of the electric charge retained in the silver particles and retaining an electric charge for a long time can be provided.

Moreover, the silver oxide is obtained by oxidizing silver that is the material of the fine particles by using the existing oxidation reactor or the like widely used in the semiconductor industry. Therefore, an inexpensive storage element capable of obviating the need for new manufacturing equipment for the storage element and allowing the investment cost for the equipment to be reduced.

Moreover, the silicon oxide 1010, which can be formed by partially oxidizing the silicon substrate 1000, can be manufactured comparatively easily by means of the existing apparatus used in the semiconductor industry. Therefore, a highly reliable storage element can be formed at low cost.

Moreover, in the process of forming the silver oxide on the surfaces of the fine particles, the defects of dangling bond and the like, which have existed on the surfaces of the silver particles, can be reduced for reformation by, for example, thermal oxidation with hydrogen added. With this arrangement, the surfaces of the silver particles can be formed into a satisfactory state in which, for example, interface states are reduced. As a result, the storage element of the present embodiment has a reduced leakage of the electric charge retained in the fine particles and is able to stably retain the memory state for a long time.

Moreover, the silver particles should preferably be formed by implanting silver ions for forming the fine particles into the silicon oxide 1010 by the ion implantation method. By using the ion implantation method, a large amount of silver ions can be implanted into the silicon oxide 1010 at a time, and a large number of fine particles can consequently be formed in the silicon oxide 1010.

In particular, the ion implantation should preferably be carried out by forming the silver ions into negative ions. In the case, the high-voltage electrification of the silicon oxide 1010 can effectively be suppressed in a state in which the silicon oxide 1010 that is the insulator is electrically floating than when the implantation is carried out in the form of positive ions. Therefore, the variation in the implantation depth of the silver ions and the defects of the silicon oxide 1010 can effectively be prevented from occurring. Moreover, since the negative ion implantation method can be carried out by changing only part of the existing ion implanter, the fine particles can be produced at low cost.

Moreover, the process of forming the silicon oxide 1010 by partially oxidizing the silicon substrate 1000 and the process of forming the silver oxide by oxidizing the surface portions of the silver particles out of the manufacturing processes of the fine particle-containing body are the processes that have conventionally been frequently carried out by using the existing semiconductor manufacturing equipment. Therefore, a series of semiconductor device manufacturing processes can be constituted together with, for example, the process of forming the source/drain regions 1030 by impurity diffusion. That is, the semiconductor device can be manufactured comparatively easily at low cost by the manufacturing equipment that has conventionally been used frequently. Moreover, the fine particle-containing body can be comparatively easily consolidated with another semiconductor device.

Although the thickness of the gate insulator (silicon oxide 1010) has been set to about 50 nm in the present embodiment, it is a matter of course that a further reduction in the film thickness can be achieved, and the reduction in the film thickness can be achieved within a range in which the thickness does not become smaller than the size of the fine particles. The gate electrode should preferably be made smaller than 5 nm, and this makes it possible to lower the operation voltage of the storage element for the achievement of driving with a voltage lower than 10 V.

As described above, the storage element of the present embodiment, which is constituted by employing the fine particle-containing body of the present invention, is therefore allowed to have high mass productivity, excellent leakage tolerance and further scale-down in size than in the conventional case. Then, by forming a storage circuit by integrating the storage elements, a compact semiconductor device can be formed. Furthermore, by constituting electronic equipment of, for example, portable communication equipment by employing the semiconductor device, the electronic equipment can be downsized.

Fourteenth Embodiment

In the present embodiment, a field effect transistor was constituted by employing a gate insulator obtained by reducing the film thickness of the silicon thermal oxide formed in the tenth embodiment to a thickness of about 5 to 10 nm, and a storage element was produced. The storage element has a construction similar to that of the thirteenth embodiment except for the gate insulator.

The gate insulator was produced by a method similar to that of the silicon thermal oxide including the fine particles of the tenth embodiment. In the process of introducing the substance for forming the fine particles by ion implantation, silver ions were implanted at an implantation angle making an angle of about 65 to 80° with respect to the normal line of the surface of the silicon thermal oxide. Moreover, the thickness of the silicon thermal oxide at the time of ion implantation was about 25 nm, and the silicon thermal oxide was etched by about 10 to 20 nm and formed into a thin film in the subsequent process.

As the result of measuring the storage element of the present embodiment as in the tenth embodiment, a threshold difference of about 2 V was caused between immediately after the application of +3 V and immediately after the application of −3 V to the gate.

As described above, it was discovered that the storage element of the present embodiment was able to perform memory operation similar to that of the flash memory and the like even with a low voltage with which the normal flash memory can hardly operate.

The above is presumably ascribed to the fact that electrons could be implanted into the silver particles with a low voltage as a consequence of the remarkable quantum effect made producible since the silver particles in the silicon thermal oxide were covered with the silver oxide in the silicon thermal oxide that operated as the gate insulator. It is further considered that the leakage of electrons from the fine particles is suppressed by the Coulomb blockade effect and the like.

The storage element of the present embodiment should preferably be reduced in thickness to the extent that the thickness of the gate insulator does not become smaller than the size of the fine particles contained in the gate insulator and set, in concrete, to a thickness smaller than 5 nm. This makes it possible to lower the operation voltage of the storage element for the achievement of driving with a voltage lower than 10 V.

Moreover, the fine particle-containing body of the present embodiment can easily be manufactured, and the manufacturing method has an affinity for the conventional silicon processes. Therefore, a semiconductor device can be constituted by easily integrating the storage element including the fine particle-containing body into another circuit. Such a semiconductor device can easily be reduced in size and power consumption. Therefore, by constituting electronic equipment of portable communication equipment or the like by employing the semiconductor device, the electronic equipment can effectively be reduced in size and power consumption.

Fifteenth Embodiment

In the present embodiment, experiments to observe the characteristic changes of the fine particle-containing body were carried out by changing the film thickness of the medium as well as the value of the implantation energy and the implantation dose of the substance for forming fine particles into the medium with regard to the fine particle-containing body.

In the present embodiment, a fine particle-containing body was formed by employing a medium of a thickness of not greater than 30 nm. More in detail, a silicon oxide of a film thickness of about 10 nm to 30 nm was employed as the medium. The silicon oxide was produced by thermally oxidizing the surface portion of a silicon substrate.

FIGS. 11A through 15D are views showing fine particle-containing bodies obtained by changing the thickness of the silicon oxide, the implantation energy of the particle formation substance and the implantation dose of the particle formation substance.

Figure 11A:
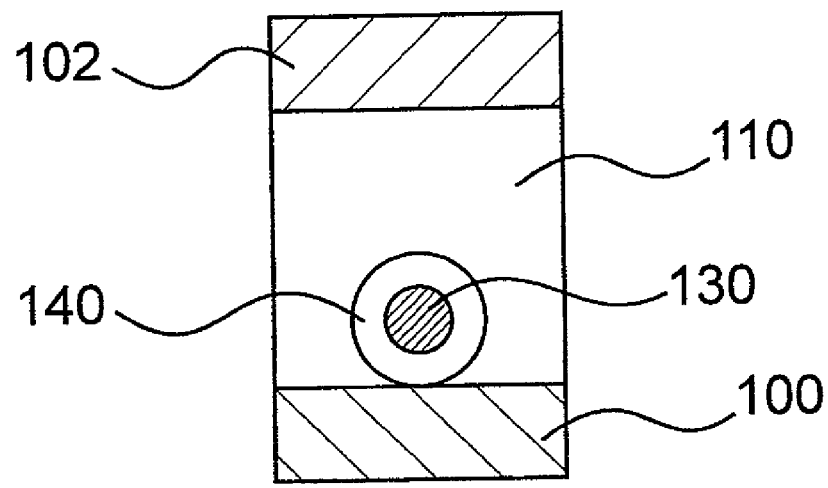
FIG. 11A is a schematic view showing a fine particle-containing body obtained when the implantation energy of the fine particle formation substance is made comparatively large.
Figure 11B:
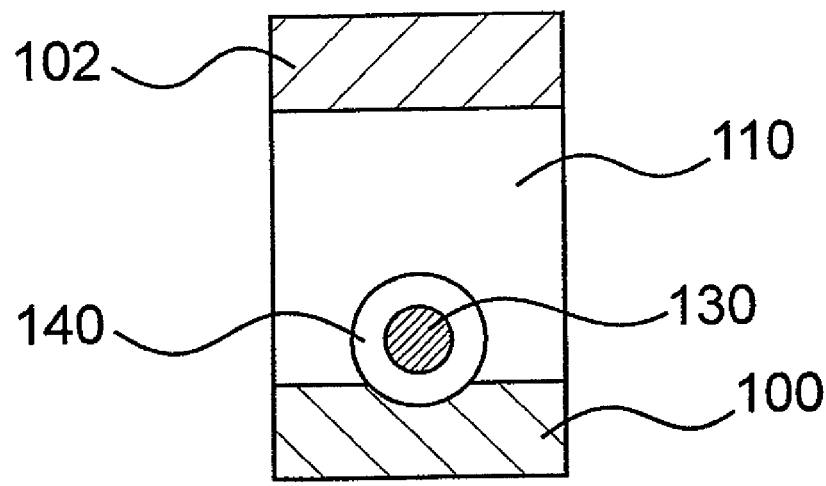
FIG. 11B is a schematic view showing a fine particle-containing body obtained when the implantation energy of the fine particle formation substance is made comparatively large.
Figure 12A:
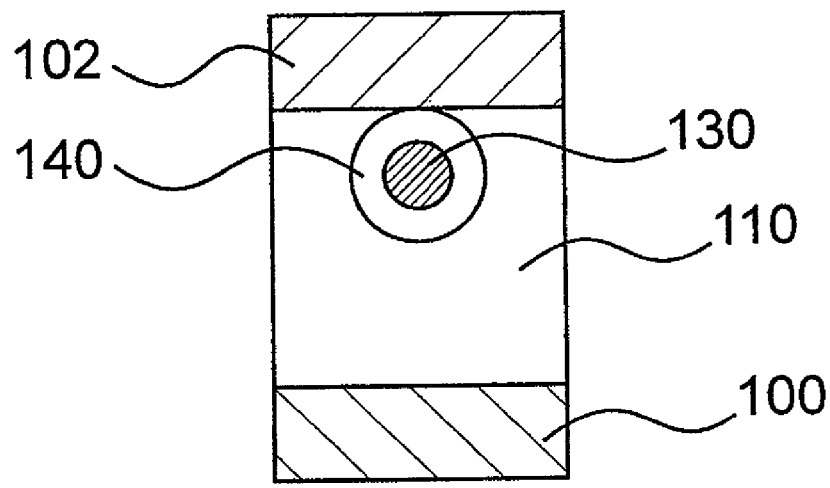
FIG. 12A is a schematic view showing a fine particle-containing body obtained when the implantation energy of the fine particle formation substance is made comparatively small.
Figure 12B:
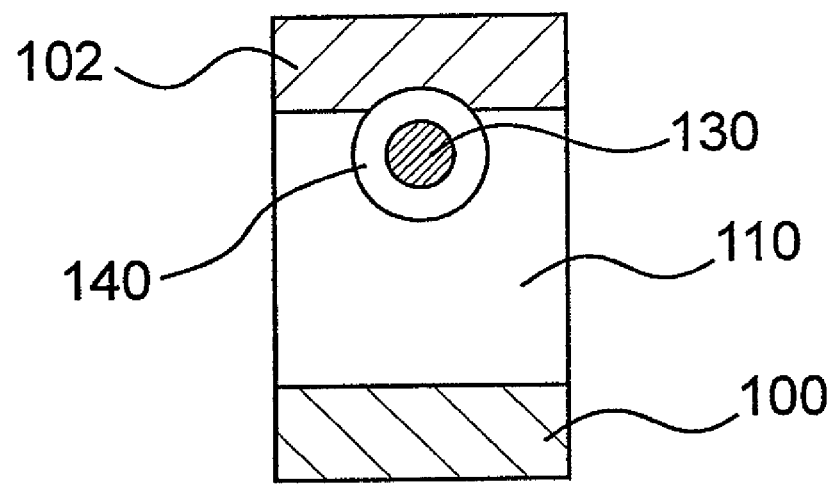
FIG. 12B is a schematic view showing a fine particle-containing body obtained when the implantation energy of the fine particle formation substance is made comparatively small.
Figure 13A:
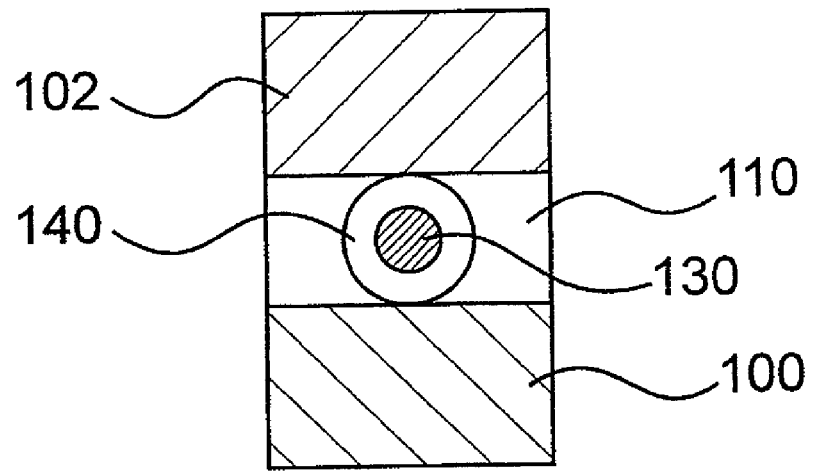
FIG. 13A is a schematic view showing a fine particle-containing body obtained when a silicon oxide is formed into a thin film.
Figure 13B:
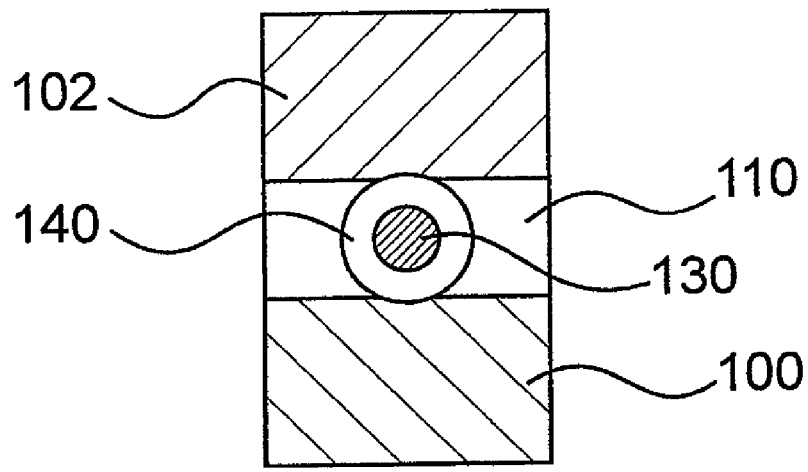
FIG. 13B is a schematic view showing a fine particle-containing body obtained when a silicon oxide is formed into a thin film.

FIGS. 11A and 11B schematically show the fine particle-containing bodies when the implantation energy of the particle formation substance is made comparatively large. FIGS. 12A and 12B schematically show the fine particle-containing bodies when the implantation energy is made comparatively small. FIGS. 13A and 13B schematically show the fine particle-containing bodies when the silicon oxide 110 is formed into a thin film. FIGS. 14A through 14D and 15A through 15D schematically show the fine particle-containing bodies when the implantation dose is increased. In the present embodiment, a silicon oxide 110 was formed on a silicon substrate 100, a fine particle 130 was formed in the silicon oxide 110, a coating layer 140 was formed by oxidizing the surface portion of the fine particle 130, and thereafter an electrode 102 was formed on the silicon oxide 110.

As the result of evaluating the electrical characteristics of the fine particle-containing bodies using the silicon substrate 100 as a first electrode and using the electrode 102 on the silicon oxide as a second electrode, it was discovered that satisfactory charge retention characteristic is basically possessed like the characteristic obtained in the first embodiment.

In the fine particle-containing body of FIG. 11A, the portion of the coating layer 140 that covers the fine particle 130 is put in contact with the semiconductor substrate 100 as the first layer. In the fine particle-containing body of FIG. 11B, the coating layer 140 has a form such that it partially sinks in the semiconductor substrate 100. The fine particle-containing bodies of FIGS. 11A and 11B are connected to paths each of which connects the fine particle 130 with the semiconductor substrate 100 not by way of the silicon oxide 110 as the medium.

In the fine particle-containing bodies of FIGS. 11A and 11B, it has been easy to put an electric charge into and out of the semiconductor substrate 100. As the result of constituting a transistor similar to those of the thirteenth and fourteenth embodiments by employing the fine particle-containing body for the gate insulator and examining the electrical characteristics, the rewrite voltage was allowed to be a low voltage. As described above, the storage element, which employs the fine particle-containing body, is able to operate with a low voltage, allowing the rewrite power consumption to be reduced.

In either one of the fine particle-containing bodies of FIGS. 11A and 11B, the silicon oxide 110 does not exist between the fine particle 130 and the silicon substrate 100, and isolation is achieved only by the coating layer 140 that covers the fine particle 130. In the conventional fine particle-containing body that has had no coating layer surrounding the fine particle, if the fine particle is put in contact with the silicon substrate, the fine particle has produced no charge retention function. In contrast to this, in the fine particle-containing body of the present invention, the surface of the fine particle is covered with the coating layer, and the coating layer is formed of an insulator or the like, which serves as a barrier to the electric charge. Therefore, even if the coating layer that covers the fine particle is put in contact with the silicon substrate, a charge retention capability can be produced. Therefore, it is possible to keep the charge retention characteristic satisfactory even if some variations are caused with regard to the distribution of the fine particles and the like, and the productivity and reliability can be improved.

FIG. 12A shows a case where the coating layer 140 is put in contact with the electrode 102. In FIG. 12B, the coating layer 140 has a form such that it partially sinks in the electrode 102. The fine particles 130 of FIGS. 12A and 12B are connected to paths each of which connects the fine particle 130 with the semiconductor substrate electrode 102 not by way of the silicon oxide 110 as the medium.

In the fine particle-containing bodies of FIGS. 12A and 12B, it was easy to put an electric charge into and out of the electrode 102. As the result of constituting a transistor similar to those of the thirteenth and fourteenth embodiments with the fine particle-containing body and examining the electrical characteristics, a comparatively wide memory window was able to be obtained. Therefore, when a storage element is constituted by employing the fine particle-containing body, the reliability of the storage element can be improved.

In either one of the fine particle-containing bodies of FIGS. 12A and 12B, the silicon oxide 110 does not exist between the fine particle 130 and the electrode 102, and isolation is achieved only by the coating layer 140 that covers the fine particle 130. By forming the coating layer 140 of an insulator or the like that serves as a barrier to the electric charge, the charge retention characteristic of the fine particle 130 can be kept satisfactory even if the coating layer 140 is put in contact with the electrode 102. Therefore, it is possible to keep the characteristics of the fine particles satisfactory even if some manufacturing variations are caused, and the productivity and reliability of the storage element or the like constituted by employing the fine particle-containing body can be improved.

FIGS. 13A and 13B show cases of fine particle-containing bodies, where the coating layer 140 that covers the fine particle 130 is put in contact with both of the silicon substrate 100 and the electrode 102. That is, the fine particles 130 of FIGS. 13A and 13B are connected to paths each of which connects the fine particle 130 with the semiconductor substrate 100 and the electrode 102 not by way of the silicon oxide 110 as the medium. The fine particle-containing bodies of FIGS. 13A and 13B are allowed to have a very low operation voltage for putting an electric charge into and out of the fine particle 130. Moreover, a comparatively large memory window can be obtained. Therefore, a memory transistor of low power consumption, high-speed operation and high reliability can be constituted.

In particular, the fine particle-containing body of FIG. 13B has a form such that the mutually different portions of the coating layer 140 sink in both the silicon substrate 100 and the electrode 102. The silicon oxide 110 does not exist between the fine particle and the silicon substrate 100 and the electrode 102, and isolation is achieved only by the coating layer 140 that covers the fine particle 130. By forming the coating layer 140 of an insulator or the like, which serves as a barrier to the electric charge, the particles 130 can reliably produce a charge retention function without short-circuiting the fine particle 130 to the silicon substrate 100 and the electrode 102 even if the silicon oxide 110 is formed into a thin film. Therefore, the fine particle-containing body can obtain satisfactory characteristics even if some manufacturing variations are caused, and the productivity and reliability can be improved. Moreover, since the silicon oxide 110 can be formed very thin, the fine particle-containing body can effectively be scaled down in size.

In the present embodiment, it is acceptable to provide a form such that the coating layer 140 partially sinks in either one of the silicon substrate 100 and the electrode 102.

The fine particle-containing bodies of FIGS. 14A through 14D have two fine particles formed with their coating layers put in contact with each other, and the two fine particles are retained juxtaposed in the widthwise direction of the medium. Any of the fine particle-containing bodies was able to obtain a comparatively wide memory window, and the charge retention characteristics were also satisfactory. Therefore, a highly reliable memory transistor can be provided by employing the fine particle-containing bodies.

Figure 14A:
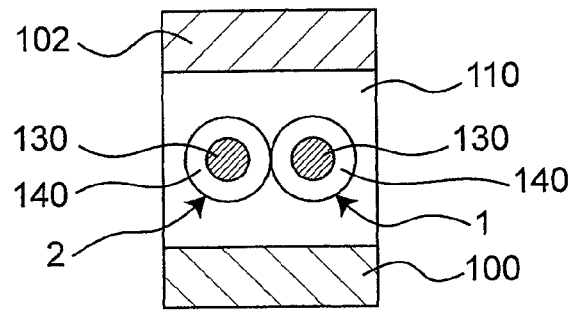
FIG. 14A is a schematic view showing a fine particle-containing body obtained when the implantation dose of the fine particle formation substance is increased.
Figure 14B:
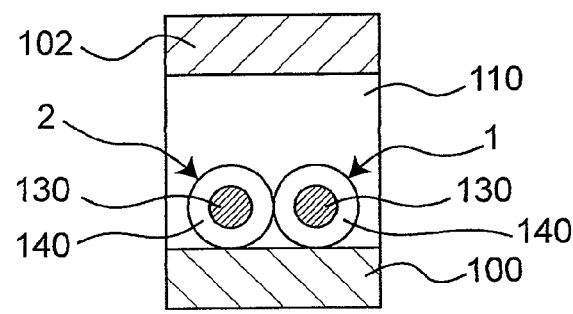
FIG. 14B is a schematic view showing a fine particle-containing body obtained when the implantation dose of the fine particle formation substance is increased.
Figure 14C:
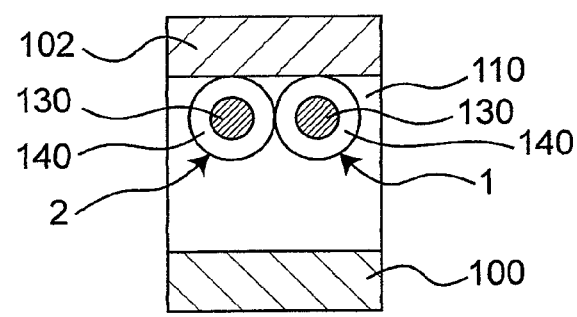
FIG. 14C is a schematic view showing a fine particle-containing body obtained when the implantation dose of the fine particle formation substance is increased.
Figure 14D:
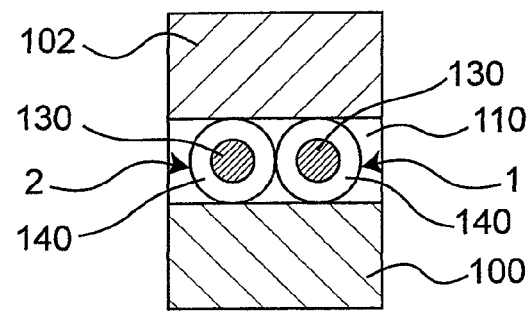
FIG. 14D is a schematic view showing a fine particle-containing body obtained when the implantation dose of the fine particle formation substance is increased.

FIG. 14A shows a case where the coating layers 140 of the two fine particles 130 are put in contact with each other and retained in the silicon oxide 110. In the fine particle-containing body of FIG. 14B, the coating layers 140 of the two fine particles 130 are put in contact with the silicon substrate 100, and the fine particles 130 are connected to paths that connect the fine particles 130 with the electrode 102 not by way of the silicon oxide 110 as the medium. In the fine particle-containing body of FIG. 14C, the coating layers 140 are put in contact with the electrode 102, and the two fine particles 130 are connected to paths that connect the fine particles 130 with the electrode 102 not by way of the silicon oxide 110 as the medium. In the fine particle-containing body of FIG. 14D, the coating layers 140 are put in contact with both the silicon substrate 100 and the electrode 102, and the two fine particles 130 are connected to paths that connect the fine particles 130 with the silicon substrate 100 and the electrode 102 not by way of the silicon oxide 110 as the medium.

In either case of the fine particle-containing bodies, the silicon oxide 110 does not exist between the two fine particles 130, and isolation is achieved only by the coating layers 140 that cover the fine particles 130. The conventional fine particle-containing body, which has retained only the fine particles in the medium, has had a disadvantage that the dimension and shape of the fine particles have been largely varied and the electrical characteristics has varied in the case of mutual contact between the fine particles. In contrast to this, in the fine particle-containing body of the present embodiment, it is possible to suppress the variation in the shape of the fine particles 130 and suppress the variation in the electric characteristics of the fine particles 130 by covering the fine particles 130 with the coating layers 140 formed of the insulator or the like that serves as a barrier to the electric charge. Moreover, since the fine particles of satisfactory characteristics can stably be obtained, the productivity and reliability of the fine particle-containing bodies can be improved. Moreover, since the density of the fine particles 130 in the thickness direction of the silicon oxide 110 can be increased, the storage element that employs the fine particle-containing body can be improved in performance and scaled down in size.

Moreover, the fine particle-containing bodies of FIGS. 14A through 14D can deliver and receive an electric charge only via the coating layer 140 not by way of the silicon oxide 110 as the medium. Therefore, it is possible to reduce the voltage necessary for delivering and receiving an electric charge and reduce a time necessary for delivering and receiving the electric charge. Therefore, when the fine particle-containing body is used for a storage element, it is possible to lower the operation voltage and increase the operation speed of the storage element. Moreover, since no medium exists between the two fine particles 130 and 130, the arrangement density of the fine particles 130 can be improved.

It is noted that the number of the fine particles 130, of which the coating layers 140 are brought in contact with each other, may be greater than two.

FIGS. 15A through 15D has two fine particles of which the coating layers are formed in contact with each other, and the two fine particles are retained juxtaposed in the thickness direction of the medium. As the result of examining the electrical characteristics of the fine particle-containing body, it has been discovered that a multi-value memory can be achieved.

Figure 15A:
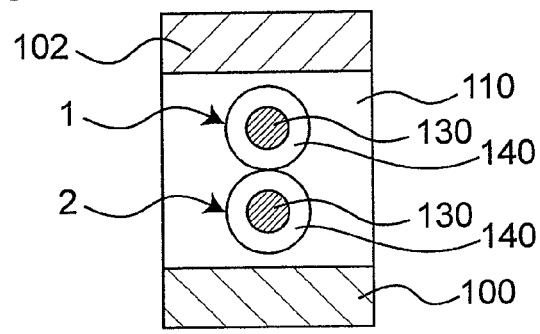
FIG. 15A is a view showing a fine particle-containing body that has two fine particles, which are retained juxtaposed in the thickness direction of the medium with the coating layers thereof put in contact with each other.
Figure 15B:
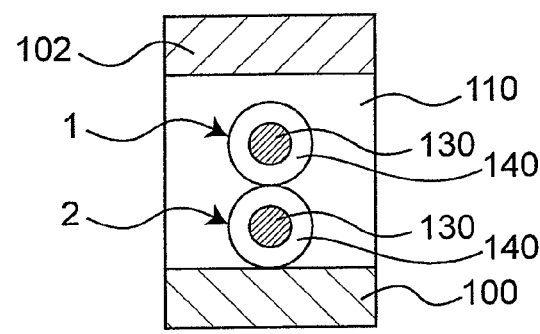
FIG. 15B is a view showing a fine particle-containing body that has two fine particles, which are retained juxtaposed in the thickness direction of the medium with the coating layers thereof put in contact with each other.
Figure 15C:
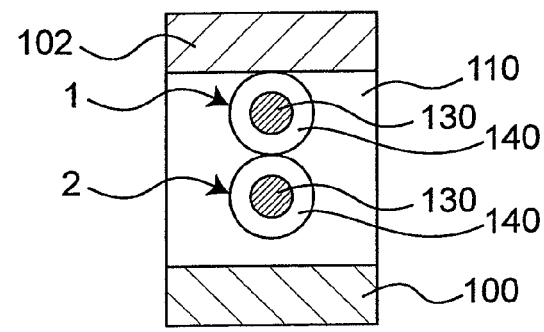
FIG. 15C is a view showing a fine particle-containing body that has two fine particles, which are retained juxtaposed in the thickness direction of the medium with the coating layers thereof put in contact with each other.
Figure 15D:
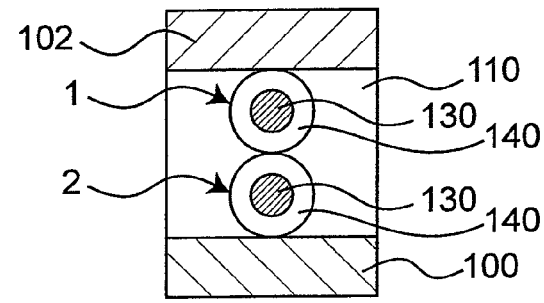
FIG. 15D is a view showing a fine particle-containing body that has two fine particles, which are retained juxtaposed in the thickness direction of the medium with the coating layers thereof put in contact with each other.

FIG. 15A shows a case where the coating layers 140 of two fine particles 130 are put in contact with each other and retained in the silicon oxide 110. In the fine particle-containing body of FIG. 15B, the coating layers 140 of two fine particles 130 are put in contact with the silicon substrate 100, and the particles 130 are connected to a path that connects the fine particles 130 with the electrode 102 not by way of the silicon oxide 110 as the medium. In the fine particle-containing body of FIG. 15C, the coating layers 140 are put in contact with the electrode 102, and the fine particles 130 are connected to a path that connects the fine particles 130 with the electrode 102 not by way of the silicon oxide 110 as the medium. In the fine particle-containing body of FIG. 15D, the coating layers 140 are put in contact with both the silicon substrate 100 and the electrode 102, and the fine particles 130 are connected to a path that connects the fine particles 130 with the silicon substrate 100 and the electrode 102 not by way of the silicon oxide 110 as the medium.

In either case of the fine particle-containing bodies, the silicon oxide 110 does not exist between the two fine particles 130, and isolation is achieved only by the coating layers 140 that cover the fine particles 130. The conventional fine particle-containing body in which only the fine particles are retained in the medium has had the disadvantage that the dimension and shape of the fine particles are largely varied and the electrical characteristics has varied in the case of mutual contact between the fine particles. In contrast to this, in the fine particle-containing body of the present embodiment, it is possible to suppress the variation in the shape of the fine particles 130 and suppress the variation in the electric characteristics of the fine particles 130 by covering the fine particles 130 with the coating layers 140 formed of the insulator or the like that serves as a barrier to the electric charge. Moreover, since the fine particles of satisfactory characteristics can stably be obtained, the productivity and reliability of the fine particle-containing bodies can be improved. Moreover, since the density of the fine particles 130 in the thickness direction of the silicon oxide 110 can be increased, the storage element that employs the fine particle-containing body can be improved in performance and scaled down in size.

As the result of examining the electrical characteristics of the fine particle-containing bodies of FIGS. 15A through 15D, it was discovered that a multi-value memory was able to be provided. As the result of forming a memory transistor and applying a voltage of +V1 to the voltage in the initial state of the fine particle-containing body of FIG. 15A, the threshold value changed to VT1 when the threshold value in the initial state was assumed to be zero. Next, as the result of applying a voltage of −V2 to the voltage in the initial state, the threshold value changed to VT2. Next, as the result of applying a voltage of +V2, the threshold value returned to VT1. Next, as the result of applying a voltage of −V1, the threshold value returned to the initial state of zero. Moreover, there was the relation: VT1>VT2>0. As a result, a memory transistor of at least three values can be provided. Moreover, the cases of FIGS. 15B, 15C and 15D were further able to permit a lowered rewrite voltage.

Moreover, the fine particle-containing bodies of FIGS. 15A through 15D deliver and receive an electric charge only via the coating layers 140 not by way of the silicon oxide 110 as the medium. Therefore, it is possible to reduce the voltage necessary for delivering and receiving an electric charge and reduce the time necessary for delivering and receiving the electric charge. Therefore, when the fine particle-containing body is used for a storage element, it is possible to lower the operation voltage and increase the operation speed of the storage element. Moreover, since no medium exists between the two fine particles 130 and 130, the arrangement density of the fine particles 130 can be improved.

It is noted that the number of the fine particles 130, of which the coating layers 140 are brought in contact with each other, may be greater than two.

In the present embodiment, fine particle-containing bodies of comparative examples were produced by changing the value of the implantation energy and the implantation dose, and flat fine particle-containing bodies such that a plurality of fine particles were fused together were obtained. As the result of forming a memory transistor by employing the fine particle-containing body that contained the fine particles and examining the electrical characteristics, it has been discovered that the retention characteristic was inferior. Fine particle-containing bodies that contained fine particles of other shapes were similarly examined with regard to the electrical characteristics, and observation was carried out by a cross-section TEM (Transmission Electron Microscope). As a result, it has been discovered that more satisfactory electrical characteristics could be obtained when the shape of the fine particles was spherical or a shape resembling a sphere. That is, a ratio of the major axis to the minor axis should preferably be not greater than two, and the ratio of the major axis to the minor axis should more preferably be not greater than 1.2 when the flattest sectional shape of the fine particle is approximated to an oval. Moreover, as the result of observing the nonspherical fine particles formed by the CVD method, it was discovered that the electrical characteristics were similarly deteriorated as the shape departed from a true spherical shape. As the result of examining the experimental results, it was discovered that a ratio of a distance to an edge farthest from the center of gravity with respect to a distance to an edge nearest to the center of gravity should preferably be not greater than two and, in particular, more preferably be not greater than 1.5 in terms of the cross section of the fine particle. The fine particle having such an external shape has almost no projecting portions and hardly causes electric field concentration. Therefore, the fluctuations and variations in the electrical characteristics due to local electric field concentration are suppressed, and satisfactory characteristics can consequently be obtained with stability.

Sixteenth Embodiment

In the present embodiment, an energy gap between the lower end of the conduction band of a substance and the vacuum level is defined as "electron affinity". Moreover, an energy gap between the Fermi level of a substance and the vacuum level is defined as "work function". Moreover, an energy gap between the upper end of the valence band of a substance and the vacuum level is defined as "ionization energy".

Figure 16:
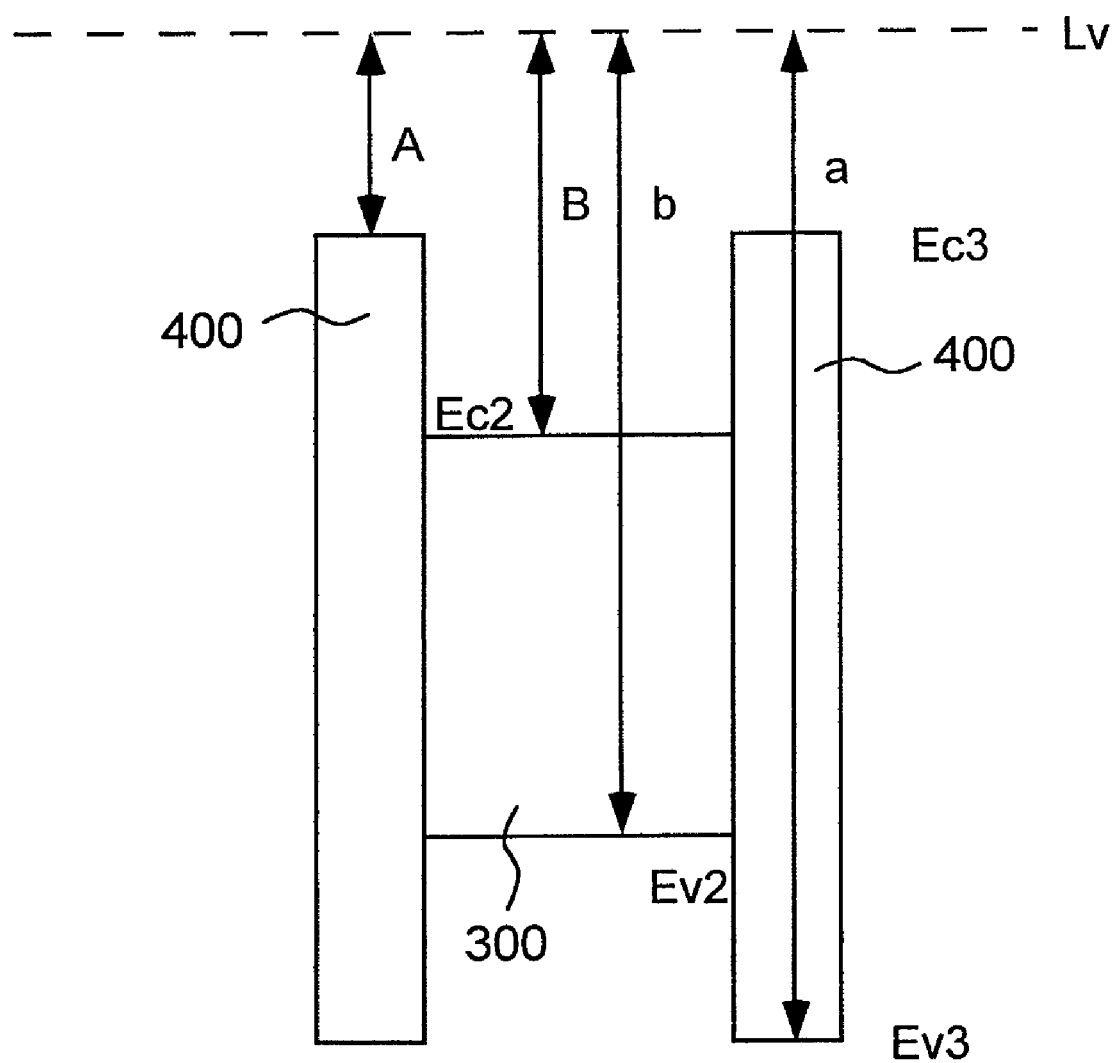
FIG. 16 is a schematic view showing energy bands of a fine particle and a coating layer possessed by a fine particle-containing body.

In the present embodiment, $HfO_2$ (hafnium oxide) is used as the second material for forming fine particles and $Al_2O_3$ is used as the third material for forming coating layers of the constituent parts of the fine particle-containing body. FIG. 16 is a schematic view showing the energy bands of the fine particle and the coating layer possessed by the fine particle-containing body. The reference numeral 300 denotes a schematic bandgap of the fine particle, and reference numeral 400 denotes a schematic bandgap of the coating layer. The band structure shown in FIG. 16 illustrates all the bands flat for the sake of simplicity. Actually, the energy band is deformed even when no potential difference is given between the electrodes. As shown in the schematic view of FIG. 16, the energy gap between the lower end Ec3 of the conduction band of the third material and the vacuum level Lv, i.e., the electron affinity A is smaller than the energy gap between the lower end Ec2 of the conduction band of the second material and the vacuum level Lv, i.e., the electron affinity B. Moreover, the energy gap between the upper end Ev3 of the valence band of the third material and the vacuum level Lv, i.e., the ionization energy "a" is greater than the energy gap between the upper end Ev2 of the valence band of the second material and the vacuum level Lv, i.e., the ionization energy "b". That is, the relations: A<B and a>b hold between the second material and the third material with regard to the electron affinities A and B and the ionization energies "a" and "b". By using the second material and the third material that hold the relations, the fine particle formed of the second material can effectively retain electrons.

It is acceptable to provide the second material and the third material by using other materials that hold the relations. For example, silicon nitride, yttrium oxide, zirconium oxide, lanthanum oxide or a material of a mixture of these materials and silicon oxide or the like can be used as the third material. Moreover, a material of silicon oxide or the like can be used as the third material.

Moreover, when materials of which the energy gap between the upper end of the valence band of the second material and the vacuum level is smaller than the energy gap between the upper end of the valence band of the third material and the vacuum level is used for the second material and the third material, holes can effectively be retained in the third material.

Seventeenth Embodiment

In the present embodiment, SOG (Spin-On-Glass) was used to form an insulator that contained fine particles. Silver, which was a substance for forming fine particles, was preliminarily added into the SOG. A liquid material was applied onto the substrate and subjected to heat treatment to form the insulator as in the case of normal SOG. Since silver is contained in the insulator, silver particles are formed by heat treatment as in the other embodiments described above. In the present embodiment, a silicon oxide is formed as the insulator. By carrying out further heat treatment in an oxidizing atmosphere after the formation of silver particles, oxygen deficiency of the silicon oxide can be reduced, and silver oxide as the coating layer is formed on the surfaces of the silver particles.

It is acceptable to mix fine particles themselves instead of mixing the substance (silver) for forming the fine particles with the liquid material. Since the diameter of the fine particle of the present embodiment has a nanometer size smaller than 1 μm, it is possible to roughly uniformly disperse the fine particles in the liquid material.

In another embodiment, a fine particle-containing body containing aluminum fine particles was formed. An SOG solution, with which aluminum fine particles were preliminarily mixed, was applied onto a substrate and subjected to heat treatment to form an insulator (silicon oxide because of the use of SOG) containing the aluminum fine particles. It is preferable to carry out the heat treatment in an oxidizing atmosphere in terms of improving the charge retention capability to allow the oxidation of the surface portion of aluminum and the reduction of the defects of the insulator to be achieved.

Each of the fine particle-containing bodies of the present embodiment exhibited satisfactory charge retention characteristics. According to the present embodiment, the process of applying the liquid material of SOG and the heat treatment process can be carried out comparatively easily by a comparatively simple apparatus. Therefore, a fine particle-containing body of satisfactory characteristics can be formed easily at low cost.

Eighteenth Embodiment

In the present embodiment, molecules containing oxygen are implanted in the form of ions into the medium in the process of reforming the surface portions of the fine particles by the fine particle-containing body manufacturing method.

The implantation energy of the molecules containing oxygen was set so that the distribution of the oxygen concentration after implantation became equal to the particle-size distribution of the fine particles as far as possible. In concrete, the molecules containing oxygen were implanted so that a depth at which the concentration of oxygen implanted in the medium roughly coincided with a depth at which the particle size of the fine particles became maximized. Subsequently, the medium into which oxygen was implanted and the fine particles were subjected to heat treatment to oxidize the surface portions of the fine particles.

By making the particle-size distribution of the fine particles roughly coincide with the distribution of the oxygen concentration, the degree of oxidation can be increased as the particle size is larger. Therefore, the fine particles that remained after the oxidation process (portions other than the surface portions of the fine particles before the oxidation process) have a variation in the particle size smaller than the variation in the particle size of the fine particles before the oxidation process. Therefore, the variation in the particle size of the fine particles can be reduced through the oxidation process. As a result, the fine particle-containing body of the present embodiment and the device that employs it can reduce the variation in the characteristics.

Although the surface portions of the fine particles were oxidized by implanting the molecules containing oxygen in the embodiment, it is acceptable to carry out nitriding of the surface portions of the fine particles by implanting molecules containing nitrogen.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a fine particle-containing body which comprises a first layer, a second layer, a medium that is formed between the first layer and the second layer and that is made of silicon oxide, a plurality of silver particles that are located in the medium and have a function to retain an electric charge, and a coating layer that covers each of the silver particles and is made of a material whose electrical conductivity is lower than that of silver, said method comprising:

forming the medium in contact with the first layer;
introducing silver for forming the silver particles by ion implantation so as to be distributed in the medium;
forming the silver particles in the medium by condensing or diffusing the silver introduced into the medium by heat treatment;
oxidizing or nitriding a surface portion of each of the silver particles so as to form the coating layer; and
forming the second layer on a side of the medium opposite to a side of the first layer,
wherein said silver particles have a diameter of less than 1 μm, and
wherein the method comprises removing a portion containing said silver or said silver particles from a surface of the medium to a prescribed depth within a period on or after the ion implantation and before the forming of the coating layer.

2. The method for manufacturing a fine particle-containing body as claimed in claim 1, wherein
after the forming of the silver particles and before the forming of the coating layer, the removing of the portion from a surface of the medium to a prescribed depth is carried out, so that a part of distribution of the silver particles is left in a remaining portion of the medium.

3. The method for manufacturing a fine particle-containing body as claimed in claim 1, wherein
after the ion implantation and before the forming of the silver particles, the removing of the portion from a surface of the medium to a prescribed depth is carried out, so that a part of distribution of the silver is left in a remaining portion of the medium.

4. The method for manufacturing a fine particle-containing body as claimed in claim 1, wherein
during the ion implantation, the removing of the portion from a surface of the medium to a prescribed depth is carried out.

* * * * *